United States Patent
Doyle et al.

(10) Patent No.: US 7,499,325 B2
(45) Date of Patent: Mar. 3, 2009

(54) FLASH MEMORY DEVICE WITH IMPROVED ERASE OPERATION

(75) Inventors: Daniel H. Doyle, Eagle, ID (US); Mark Helm, Boise, ID (US); Andrei Mihnea, Boise, ID (US)

(73) Assignee: Intel Corporation, Santa Clara, CA (US)

(*) Notice: Subject to any disclaimer, the term of this patent is extended or adjusted under 35 U.S.C. 154(b) by 41 days.

(21) Appl. No.: 11/614,820

(22) Filed: Dec. 21, 2006

(65) Prior Publication Data

US 2008/0151646 A1    Jun. 26, 2008

(51) Int. Cl.
  G11C 16/04    (2006.01)
(52) U.S. Cl. .............. 365/185.14; 365/185.29; 365/218
(58) Field of Classification Search ............ 365/185.14, 365/185.29, 218
  See application file for complete search history.

(56) References Cited

U.S. PATENT DOCUMENTS 7,088,620 B2 *   8/2006   Kawai et al. ........... 365/185.18
2003/0184963 A1 * 10/2003 Eskildsen et al. ........... 361/684
2005/0254302 A1 * 11/2005 Noguchi ................ 365/185.17
2006/0221708 A1 * 10/2006 Higashitani ............ 365/185.29

* cited by examiner

Primary Examiner—Connie C Yoha
(74) Attorney, Agent, or Firm—Schwegman, Lundberg & Woessner, P.A.

(57) ABSTRACT

Some embodiments include a device having memory cells coupled to a well of a semiconductor substrate, and a select transistor coupled between the memory cells and a bit line of the device. The device may have a first circuit to raise a well voltage of the well from a first well voltage level to a second well voltage level during an erase operation. The first circuit may hold the well at the second well voltage level for a time interval during the erase operation. The device may have a second circuit to raise a voltage of the gate of the select transistor from a first gate voltage level to a second gate voltage level, which may be lower than the second well voltage level. The second circuit may hold the gate at the second gate voltage level for a time interval during the erase operation. Other embodiments including additional apparatus, systems, and methods are disclosed.

28 Claims, 16 Drawing Sheets

US 7,499,325 B2

FLASH MEMORY DEVICE WITH IMPROVED ERASE OPERATION

FIELD

Embodiments of this disclosure relate to non-volatile memory devices, including erase operations in flash memory devices.

BACKGROUND

Non-volatile memory devices such as flash memory devices are used to store data or information. Many computers and electronic devices, for example, digital audio players, digital cameras, digital recorders, and cellular phones, have flash memory devices. Flash memory devices may also be used as portable storage devices such as portable Universal Serial Bus (USB) flash drives or "thumb" drives. Flash memory devices may not need power to maintain the information stored in the device.

A flash memory device stores information in numerous memory cells, which are usually formed in a semiconductor chip. Each of the memory cells often has a metal-oxide semiconductor (MOS) transistor with two different transistor gates: a control gate and a so-called "floating" gate. The control gate may be used to turn the transistor on and off to control access to the memory cell. The floating gate may be the place where one or more bits of information may be stored in each memory cell.

The value of the information stored in the floating gate may be determined by the amount of electrons or charge in the floating gate. For example, the information stored in the floating gate may have a first value (e.g., logic zero or binary 0 value) when an excess amount of electrons is present in the floating gate and a second value (e.g., logic one or binary 1 value) when the excess amount of electrons is absent from the floating gate. The presence or absence of the excess amount of electrons in the floating gate may be controlled by varying the amount of electrons in the floating gate, for example, by either adding electrons to or extracting electrons from the floating gate.

A flash memory device usually has a programming or write operation to add electrons to the floating gate, and an erase operation to extract electrons from the floating gate. An erase operation in a conventional flash memory device may involve applying voltages to the control gates of the transistors and to other device components within the flash memory device.

DETAILED DESCRIPTION

Figure 1:
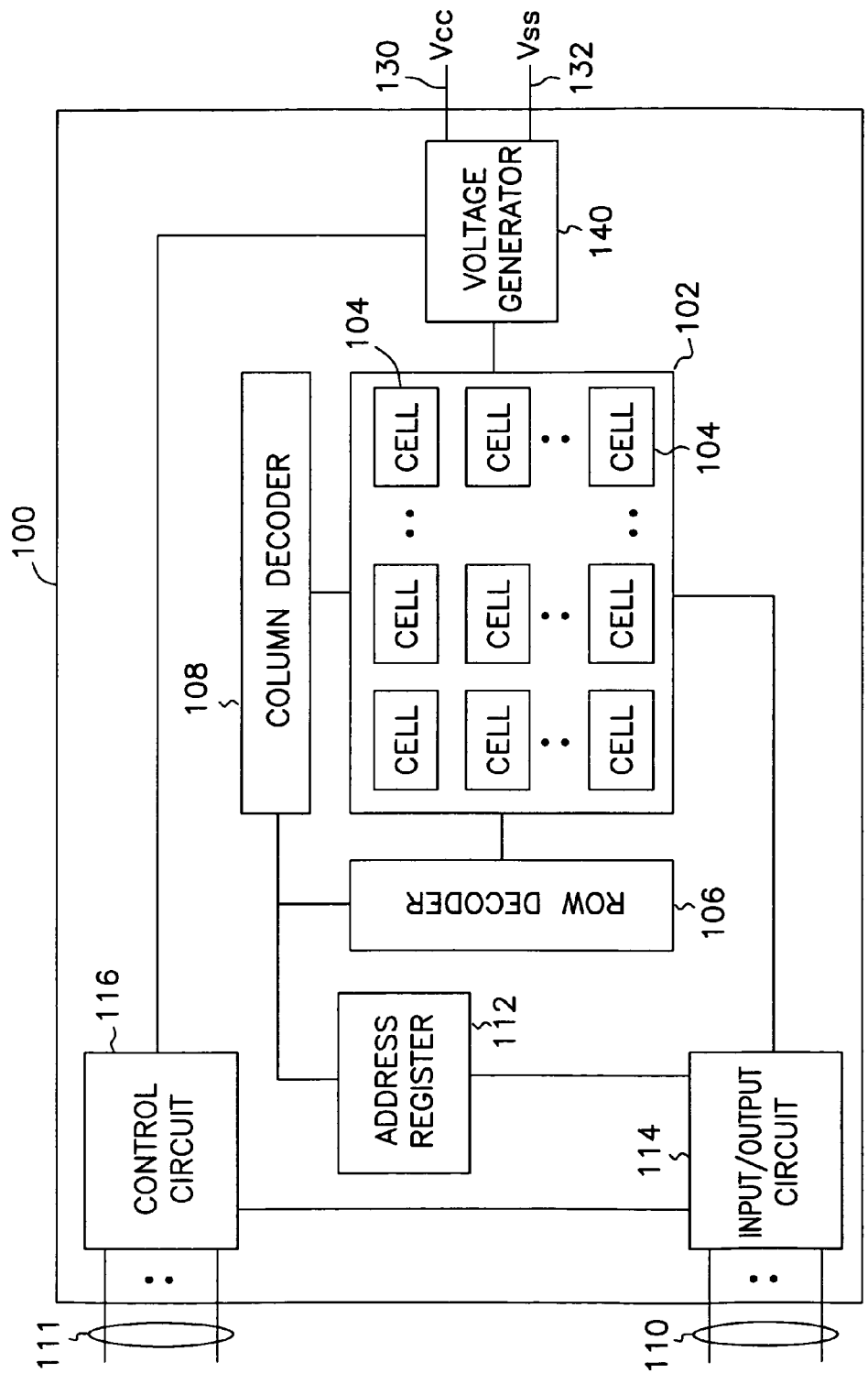
FIG. 1 shows a block diagram of a memory device according to an embodiment of the invention.

FIG. 1 shows a block diagram of a memory device 100 according to an embodiment of the invention. Memory device 100 may include a memory array 102 with memory cells 104 arranged in rows and columns. Row decoder 106 and column decoder 108 may respond to an address register 112 and access memory cells 104 based on row address and column address signals on lines 110. A data input/output circuit 114 may transfer data between memory cells 104 and lines 110. A control circuit 116 may control operations of memory device 100 based on signals on lines 110 and 111. Memory device 100 may be a flash memory device. In some embodiments, memory device 100 may include a NAND flash memory device where memory cells 104 may include flash memory cells arrange in a NAND flash memory arrangement. One skilled in the art will readily recognize that memory device 100 may include other parts, which are omitted from FIG. 1 to focus on the various embodiments described herein.

Memory device 100 may include nodes 130 and 132 to receive voltages Vcc and Vss. Vcc may be the supply voltage for memory device 100, Vss may be ground. Memory device 100 may also include a voltage generator 140. Voltage generator 140 and control circuit 116 may act separately or together to provide different voltages to memory array 102 or to cause memory array 102 to have different voltages during various operations of memory device 100. The operations may include a programming operation to transfer or write data from lines 110 to memory cells 104, a read operation to transfer or read data from memory cells 104 to lines 110, and an erase operation to erase or clear data from all or a portion of memory cells 104. In some embodiments, memory device 100 may include embodiments of FIG. 2 through FIG. 11 described below.

Figure 2:
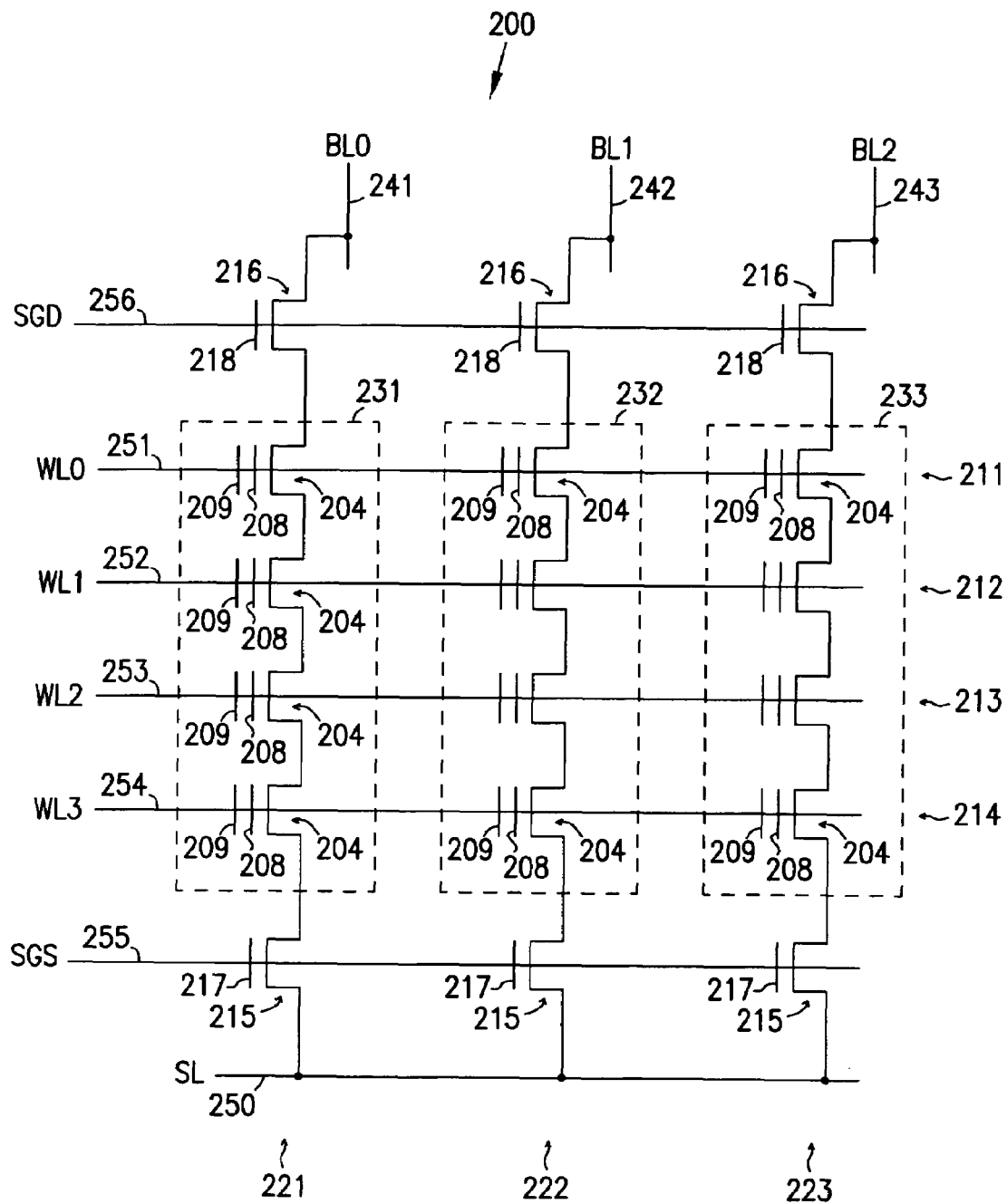
FIG. 2 shows a partial schematic diagram of a memory device according to an embodiment of the invention.

FIG. 2 shows a partial schematic diagram of a memory device 200 according to an embodiment of the invention. Memory device 200 may be included in memory device 100 of FIG. 1. In FIG. 2, memory device 200 may include a number of memory cells 204 arranged in rows 211, 212, 213, and 214, and columns 221, 222, and 223. The memory cells in the same column may be connected in series or in a string of memory cells, such as strings 231, 232, and 233. FIG. 2 shows an example where each string 231, 232, or 233 may include four memory cells 204. In some embodiments, the number of memory cells in each of strings 231, 232, and 233 may vary.

In FIG. 2, memory device 200 may include select transistors 215, each being coupled between one of strings 231, 232, and 233 and a source line 250 having source line signal SL. Each select transistor 215 may include a gate 217 coupled to a select line 255. A select signal SGS on select line 255 may be used to activate (turn on) select transistors 215.

Memory device 200 may also include select transistors 216, each being coupled between one of strings 231, 232, and 233 and of bit lines 241, 242, and 243 having corresponding bit line signals BL0, BL1, and BL2. Each select transistor 216 may include a gate 218 coupled to a select line 256. A select signal SGD on select line 256 may be used to activate select transistors 216.

Each memory cell 204 may include a floating gate 208 and a control gate 209. The control gates 209 of memory cells 204 in the same row (row 211, 212, 213, or 214) maybe coupled to one of word lines 251, 252, 253, and 254. Word lines signals WL0, WL1, WL2, and WL3 on word lines 251, 252, 253, and 254 may be used activate to memory cells 204.

FIG. 2 shows each of select transistors 215 and 216 with a single gate (e.g., gate 217 or 218). In some embodiments, each of select transistors 215 and 216 may include two gates, similar or identical to those in each of the memory cells 204, but the two gates may be tied together (shorted) to act as a single gate transistor.

In FIG. 2, to program, read, or erase memory cells 204, appropriate voltages may be applied to select lines 255 and 256, word lines 251, 252, 253, and 254, bit lines 241, 242, and 243, and source line 250. Further, during a programming, read, or erase operation of memory device 200, appropriate voltages may also be applied to a semiconductor substrate or to a well where at least a portion of memory cells 204 may be formed. An example embodiment of a semiconductor substrate, a well, and various voltage levels during an erase operation of memory device 200 is described with reference to FIG. 3 below.

Figure 3:
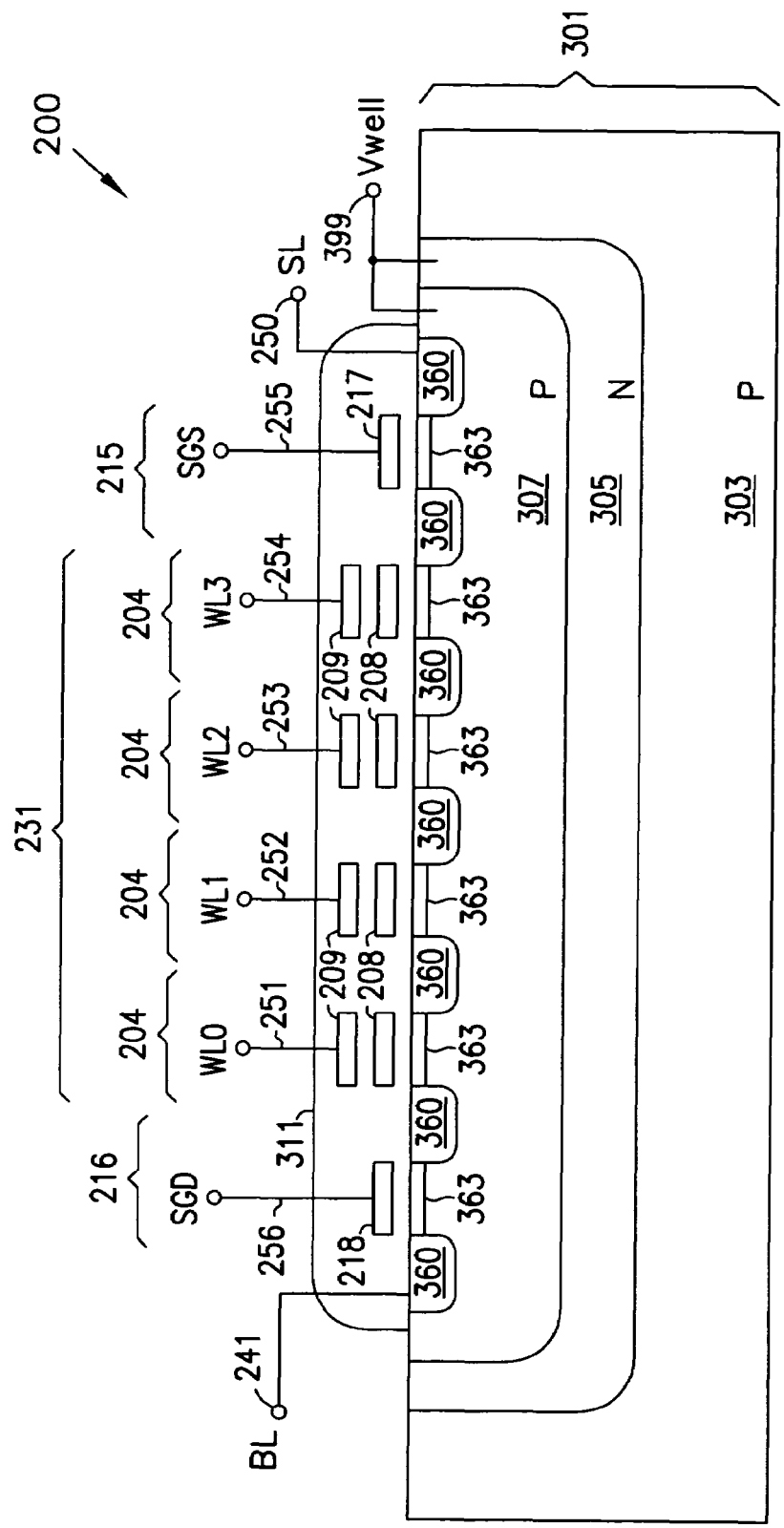
FIG. 3 shows a partial cross-section of a portion of the memory array of FIG. 2.

FIG. 3 shows a partial cross-section of memory device 200 of FIG. 2. In FIG. 3, memory device 200 may include a substrate 301 with substrate portions or wells 303, 305, and 307. "P" and "N" in FIG. 3 indicate different semiconductor material types in various portions of substrate 301. Memory cells 204 may be coupled to well 307 and may be connected in series or in a string. FIG. 3 shows a partial cross-section of one string (e.g., string 231) of memory device 200 (FIG. 2). Other strings (e.g., strings 232 and 233 in FIG. 2) may have a structure similar or identical to the structure shown in FIG. 3.

As shown in FIG. 3, in each memory cell 204, floating gate 208 and control gate 209 may be formed above source/drain regions 360 and are isolated from each other by an insulating material 311. Well 305, well 307, or both may be coupled to a monitor node 399, which has a corresponding well voltage or signal $V_{WELL}$. Each region 360 may be a source or drain region of a transistor or a source/drain region shared by two transistors, as shown in FIG. 3.

In operation, by activating WL0, WL1, WL2, and WL3, SGD, and SGS to appropriate voltage levels and applying an appropriate voltage to well 307, conductive channels 363 may be formed among source/drain regions 360, thereby creating a conductive path between bit line 241 and source line 250. The conductive path may be used to transfer data (in the form of charge) between memory cells 204 and bit line 241.

In the description herein, when SGS is mentioned, it may refer to the signal on a select line (e.g., signal SGS on select line 255), the select line itself (e.g., select line 255), or the gate of a select transistor corresponding to SGS (e.g., gate 217 of select transistor 215). Similarly, when SGD is mentioned, it may refer to the signal on a select line (e.g., signal SGD on select line 256), the select line itself (e.g., select line 256), or the gate of a select transistor corresponding to SGD (e.g., gate 218 of select transistor 216).

In FIG. 3, during the erase operation, WL0, WL1, WL2, and WL3 may be held at a word line voltage, SGS and SGD may be held at a first gate voltage level (e.g., ground), and $V_{WELL}$ may be raised from a first well voltage level (e.g., ground) to a second well voltage level. When $V_{WELL}$ reaches an intermediate well voltage level, which may be a voltage level between the first and second well voltage levels, SGS and SGD may be released from the first gate voltage level and may be allowed to "float", meaning that the voltages at SGS and SGD may rise from the first gate voltage level to a second gate voltage level while $V_{WELL}$ may continue rise from the intermediate well voltage level to the second well voltage level. The second voltage level of SGS and SGD may be lower than the second well voltage level of $V_{WELL}$. In some embodiments, before $V_{WELL}$ reaches the intermediate well voltage level, the word line voltage level (level of WL0, WL1, WL2, and WL3) and the first gate voltage level (level at SGS and SGD) may be substantially equal, e.g., both may be ground or at some equaled voltage level.

In some embodiments, SGS and SGD may not be held at the first voltage level but allowed to rise before $V_{WELL}$ reaching the intermediate well voltage level. Data from memory cells 204 may be erased when $V_{WELL}$ reaches the second well voltage level. Different or new data may be programmed into the memory cells in a programming operation.

As described above, the second voltage level of SGS and SGD may be lower than the second well voltage level of $V_{WELL}$. If the second voltage level of SGS and SGD is not lower than (e.g. substantially equal to) the second well voltage level of $V_{WELL}$, then the voltage difference between control gates 209 (having the word line voltage level) and each of gates 217 and 218 (the second gate voltage level at SGS and SGD) may be a relatively higher voltage difference in comparison with the voltage difference between control gates 209 and each of gates 217 and 218 in an erase operation such as the erase operation described above where SGS and SGD may be lower than the second voltage level of $V_{WELL}$. The relatively higher voltage difference may unintentionally extract electrons from control gate 209 or floating gate 208 (or both) in memory cells 204 that are adjacent to select transistors 215 and 216 (i.e., memory cells 204 corresponding to WL0 and WL3). The extracted electrons may be trapped in an area of memory device 200, e.g., an area in the insulating material 311 between select transistor 215 and the adjacent memory cell 204 corresponding to WL0, or in an area in the insulating material 311 between select transistor 216 and the adjacent memory cell 204 corresponding to WL3. The trapped electrons may degrade the performance or life (or both) of memory device 200. Further, the relatively higher voltage difference between control gates 209 and each of gates 217 and 218 may also create non-uniform erase threshold voltage among memory cells 204.

In memory device 200, when the voltage difference between control gates 209 and each of gates 217 and 218 may relatively be a lower voltage reference, the unintentional extraction of electrons from control gates 209 or floating gates 208 (or both gates 208 and 209) in memory cells 204 that are adjacent to select transistors 215 and 216 may be reduced. Further, the relatively lower voltage difference between control gates 209 and each of gates 217 and 218 may also improve erase threshold voltage uniformity among memory cells 204. Therefore memory device 200 may have an improved performance or life, or both.

Figure 4:
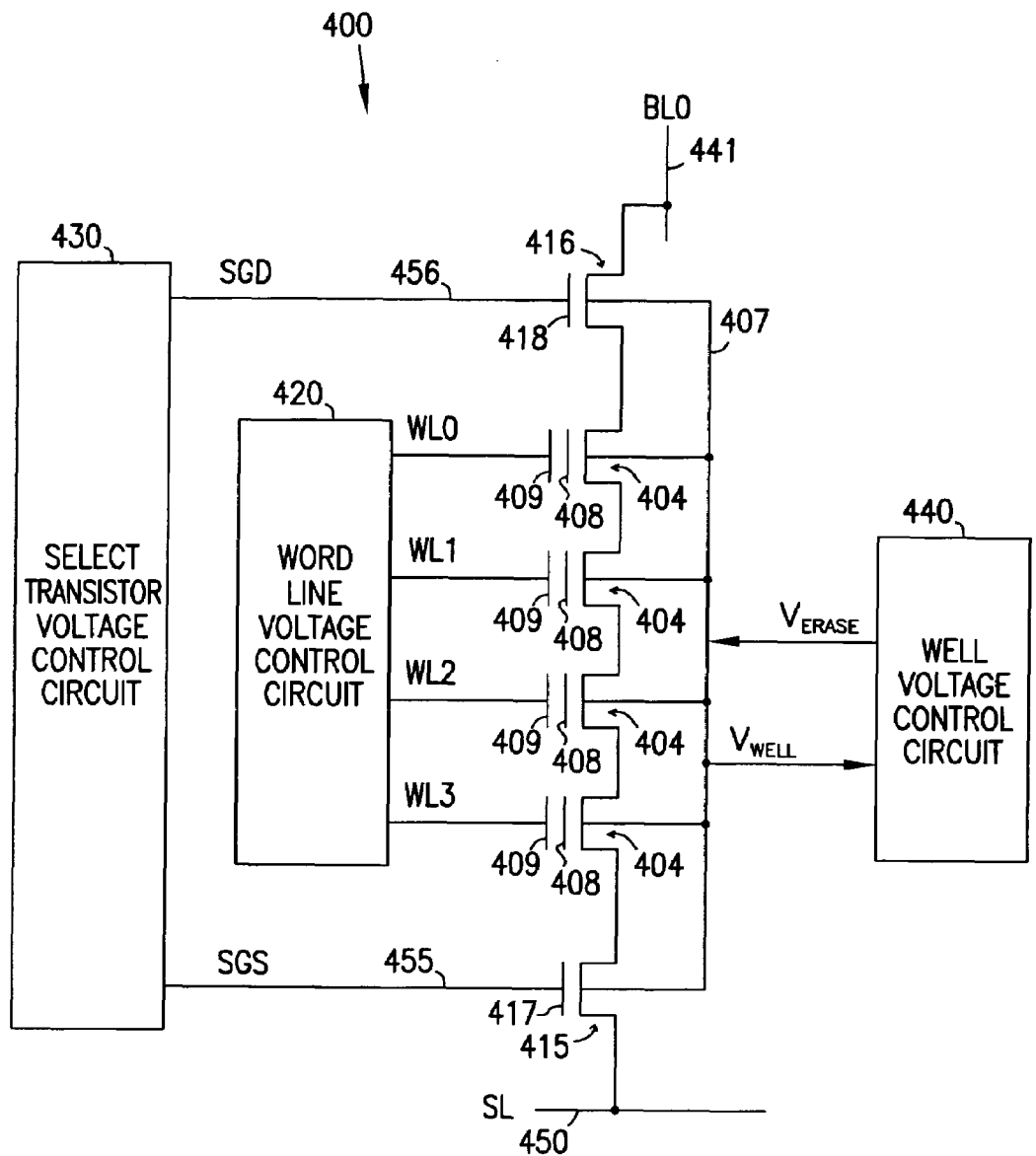
FIG. 4 shows a partial schematic diagram of a memory device according an embodiment of the invention.

FIG. 4 shows a partial schematic diagram of memory device 400 according an embodiment of the invention. In some embodiments, memory device 400 may be included in memory device 100 of FIG. 1.

In FIG. 4, memory device 400 may include a string of memory cells 404 coupled to a bit line 441 (having bit line signal BL0) via a select transistor 416 and to a source line 450 (having source line signal SL) via a select transistor 415. Control gates 409 of memory cells 404 may be coupled to receive word lines signals WL0, WL1, WL2, and WL3. Select transistor 415 may include a gate 417 coupled to a select line 455 to receive a select signal SGS. Select transistor 416 may include a gate 418 coupled to a select line 456 to receive a select signal SGD. Memory cells 404 and select transistors 415 and 416 may be coupled to a well of a semiconductor substrate that is similar or identical to one or more of well 305 and well 307 of substrate 301 of FIG. 3. In FIG. 4, the well (on which at least a portion of memory cells 404 and select transistors 415 and 416 may be formed) is schematically shown as well 407.

Memory device 400 may also include a word line voltage control circuit 420 to control the voltage levels of WL0, WL1, WL2, and WL3. A select transistor voltage control circuit 430 may control the voltage levels of SGS and SGD during an erase operation. A well voltage control circuit 440 may control and monitor the voltage level of well 407 during an erase operation. FIG. 4 shows an example where memory device 400 may include three separate circuits 420, 430, and 440 in separate boxes. In some embodiments, circuits 420, 430, and 440 may be separated into more than three circuit, combined into fewer circuits or in a single circuit, or may be at least a part of at least one of a voltage generator and control circuit such as voltage generator 140 and control circuit 116 of FIG. 1. FIG. 4 shows memory device 400 with one string of memory cells 404 to concentrate in the subject matter of the embodiments described herein. In some embodiments, memory device 400 may include numerous memory strings similar or identical to string of memory cells 404 shown in FIG. 4.

During an erase operation, word line voltage control circuit 420 may hold control gates 409 of memory cells 404 at a word line voltage. In some embodiments, the word line voltage (voltage level of WL0, WL1, WL2, and WL3) during the erase operation may be ground or zero volts, or some other voltage. In the erase operation, well voltage control circuit 440 may charge or apply an erase voltage $V_{ERASE}$ to well 407. When $V_{ERASE}$ is applied, a well voltage $V_{WELL}$ of well 407 may rise or ramp from a first well voltage level to a second well voltage level. Select transistor voltage control circuit 430 may control SGS and SGD based on $V_{WELL}$.

In some embodiments, select transistor voltage control circuit 430 may hold SGS and SGD at a first gate voltage level when $V_{WELL}$ is lower than an intermediate well voltage level. The intermediate well voltage level may be between the first and second well voltage levels. When $V_{WELL}$ reaches the intermediate well voltage level, select transistor voltage control circuit 430 may then release SGS and SGD from the first gate voltage level. After being released from the first gate voltage level, SGS and SGD may float and rise from the first gate voltage level to a second gate voltage level while $V_{WELL}$ may continue to rise from the intermediate well voltage level to the second voltage level. Thus, in FIG. 4, during an erase operation, well 407 may have two $V_{WELL}$ voltage profiles (first to intermediate well voltage level and intermediate to second well voltage level) in which the biasing of voltage levels of SGS and SGD may be altered (held then released) between the two voltage profiles of $V_{WELL}$.

In some embodiments, select transistor voltage control circuit 430 may not hold SGS and SGD at the first gate voltage level but allow SGS and SGD to rise when $V_{WELL}$ is lower than the intermediate well voltage level. In these embodiments, select transistor voltage control circuit 430 may allow SGS and SGD to continue to rise from the first gate voltage level to the second gate voltage level while $V_{WELL}$ rises from the first well voltage level to the second well voltage level.

In the erase operation described above, the second gate voltage level may be lower than the second well voltage level in both situations, in the situation where SGS and SGD are held at the first gate voltage level when $V_{WELL}$ is lower than the intermediate well voltage level, and in the situation where SGS and SGD are held not at the first gate voltage level when $V_{WELL}$ is lower than the intermediate well voltage level.

Figure 5:
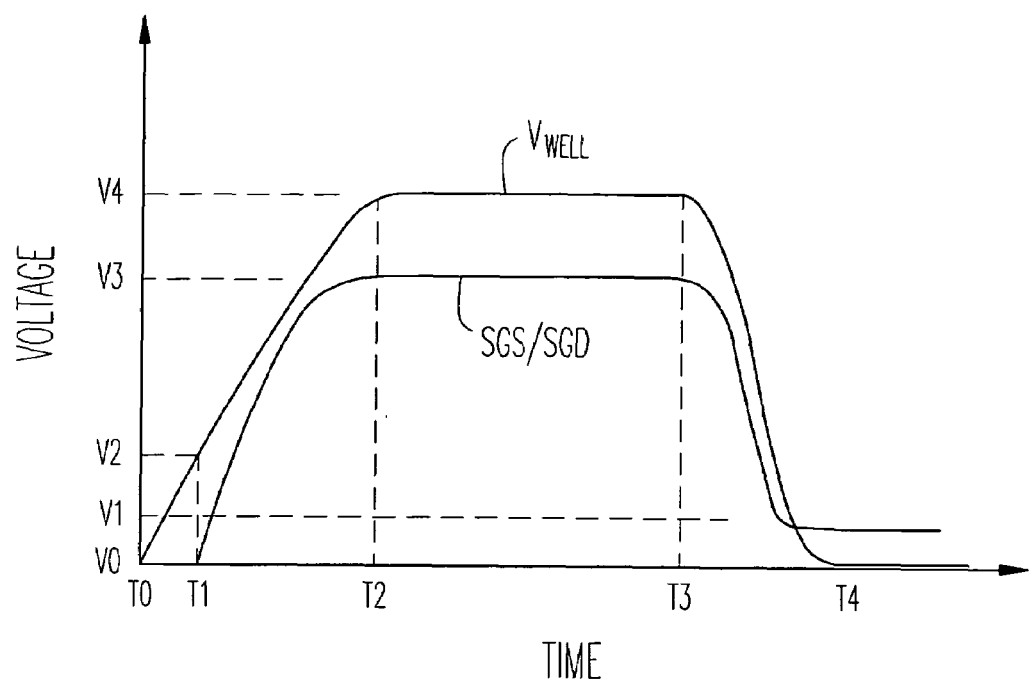
FIG. 5 is an example timing diagram of various signals of FIG. 4 during an erase operation.

FIG. 5 is an example timing diagram of various signals of FIG. 4 during an erase operation. In FIG. 5, T0, T1, T2, T3, and T4 represent different times, and V0, V1, V2, V3, and V4 represent different voltage levels with V2 being an intermediate well voltage level, V3 being the second gate voltage level, and V4 being the second well voltage level. In some embodiments, during an erase operation, V3 may be the highest voltage level of SGS and SGD during an erase operation, and V4 may be the highest voltage level of $V_{WELL}$.

In some embodiments, V0 may be ground or zero volts, V2 may be in a range of about two volts to about five volts or in a range of about one volt to about six volts, V3 may be in a range of about nine volts to about 15 volts, and V4 may be in a range of about 16 volts to about 22 volts. In some embodiments, V2 may be lower than one volt or higher than six volts. In some embodiments, the voltage values of V0, V1, V2, V3, and V4 may vary.

Between T0 and T1, SGS and SGD may be held at V0 while $V_{WELL}$ may rise from V0 to V2.

When $V_{WELL}$ reaches V2 at time T1, SGS and SGD may be released from V0 and begin to rise from V0 to V3 while $V_{WELL}$ may continue to rise from V2 to V4.

FIG. 5 shows an example where SGS and SGD may be held at V0 from time T0 to time T1. In some embodiments, SGS and SGD may not be held at V0 from time T0 to time T1 (as shown in FIG. 5) but may be allowed to rise from V0 at time T0 (similarly to $V_{WELL}$ in FIG. 5) to V3 at time T2 while $V_{WELL}$ may rise from V0 to V4.

From time T2 to time T3 in the example of FIG. 5, $V_{WELL}$ may be held or remain at V4 for a time interval and SGS and SGD may be held or remain at V3 for a time interval to allow appropriate time to erase memory cells 404 (FIG. 4). Data in floating gates 408 of memory cells 404 may be erased between times T1 and T3. In some embodiments, $V_{WELL}$ may be held at V4 and SGD may be held V3 for a time interval of at least 20 μs (microseconds). In some embodiments, the time interval between T2 and T3 may be from about 200 μs to about 1000 μs.

At time T3, well 407 (FIG. 4) and SGS and SGD may begin to discharge. As shown in FIG. 5, $V_{WELL}$ may begin to drop from V4 at time T3 to V0 at time T4 when well 407 discharges. SGS and SGD may also drop from V3 as $V_{WELL}$ drops. At a time after time T3, SGS and SGD may be held at V1 to discharge bit line 441 (FIG. 4). FIG. 5 omits the waveform of word line voltage (voltage level of WL0, WL1, WL2, and WL3) at control gates 409 during the erase operation for clarity.

As mentioned in above in the description of FIG. 4, the word line voltage at control gates 409 during the erase operation may be ground or zero volts, or some other voltage. In FIG. 5, V0 may be the word line voltage at control gates 409 during the erase operation. Thus, between times T0 and T1, the voltage difference between the word line voltage at control gates 409 (e.g., V0) and SGS and SGD at each of gates 417 and 418 (e.g., V0) may be lower than the voltage difference between the word line voltage at control gates 409 (e.g., V0) and SGS and SGD in a situation where the word line voltage level and each of SGS and SGD are different or unequal. Further, as shown in FIG. 5, V3 may be lower than V4. Thus, between times T2 and T3 where the word line voltage may be at V0, the voltage difference between SGS and SGD (e.g., V3) and the word line voltage (e.g., V0) may relatively be a relatively lower voltage difference in comparison with the voltage difference between SGS and SGD and the word line voltage in a situation where SGS and SGD may be at V4 or substantially equal to $V_{WELL}$ between times T2 and T3. The relatively lower voltage reference may reduce the unintentional extraction of electrons from control gates 409 or floating gates 408 of memory cells 404 (FIG. 4) or improve erase threshold voltage uniformity among memory cells 404.

Figure 6:
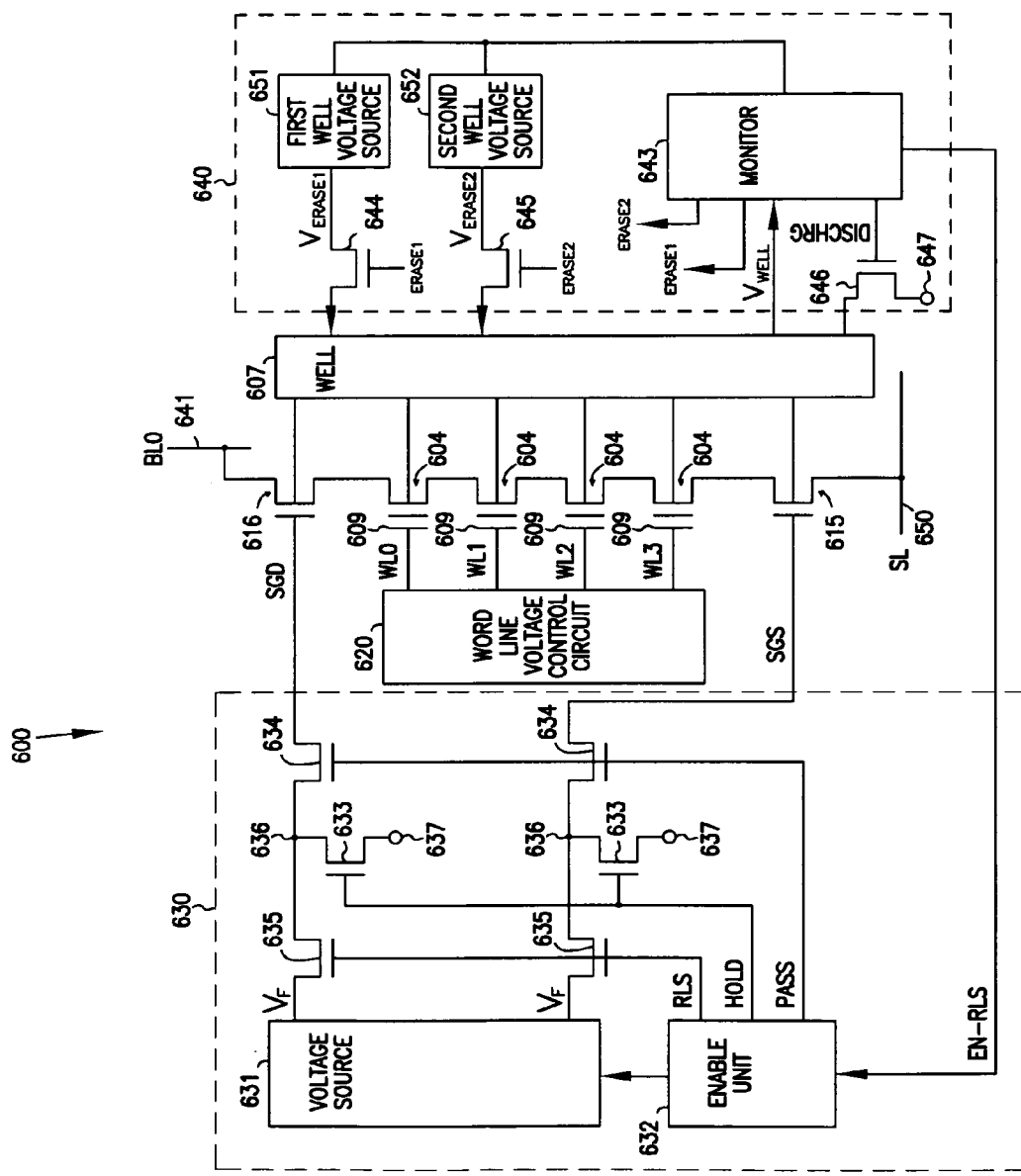
FIG. 6 shows a partial schematic diagram of a flash memory device with multiple erase voltage sources according an embodiment of the invention.

FIG. 6 shows a partial schematic diagram of a flash memory device 600 with multiple erase voltage sources according to an embodiment of the invention. Memory device 600 may include a string of memory cells 604 coupled to a bit line 641 (having bit line signal BL0) via a select transistor 616 and to a source line 650 (having source line signal SL) via a select transistor 615. Control gates 609 of memory cells 604 may be coupled to receive word lines signals WL0, WL1, WL2, and WL3 from a word line voltage control circuit 620. The gates of select transistors 615 and 616 may be coupled to receive select signals SGS and SGD, respectively. Memory cells 604 and select transistors 615 and 616 may be coupled to a well of a semiconductor substrate that is similar or identical to well 307 of substrate 301 of FIG. 3. In FIG. 6, the well (on which at least a portion of memory cells 604 and select transistors 615 and 616 may be formed) is schematically shown as well 607.

Memory device 600 may include a select transistor voltage control circuit 630 having a voltage source 631 to provide a voltage $V_F$, and an enable unit 632 to provide various signals including a signal PASS to control the activation of transistors 634, a signal HOLD to control the activation of transistors 633, and a signal RLS to control the activation of transistors 635. Each of transistors 633 may be coupled between nodes 636 and 637. In some embodiments, node 637 may be coupled to a supply node with a positive or negative voltage. In some embodiments, node 637 may be coupled to ground.

Memory device 600 of FIG. 6 may also include a well voltage control circuit 640 having voltage sources 651 and 652 to provide erase voltages $V_{ERASE1}$ and $V_{ERASE2}$ to well 607, and a monitor 643 to monitor a well voltage $V_{WELL}$. Monitor 643 may provide a signal ERASE1 to control the activation of a transistor 644, a signal ERASE2 to control the activation of a transistor 645, and a signal DISCHRG to control the activation of a transistor 646. Transistor 646 may provide a path from well 607 to node 647. In some embodiments, node 647 may be coupled to a supply node with a voltage. In other embodiments, node 647 may be coupled to ground. Monitor 643 in FIG. 6 also provide a signal EN-RLS to enable unit 632.

In the description herein, the components of a memory device (e.g., memory device 600) may be located in particular circuit blocks for ease of illustrating the embodiments of the invention. In some embodiments, the locations of the components of the memory device may vary. For example, in FIG. 6, some of the components in one circuit block of memory device 600 may be located in another circuit block.

During an erase operation of memory device 600, word line voltage control circuit 620 may hold WL0, WL1, WL2, and WL3 at a word line voltage, which may be ground or some other voltage. The voltages at well 607 and SGS and SGD during the erase operation are described in detail with reference to FIG. 7.

Figure 7:
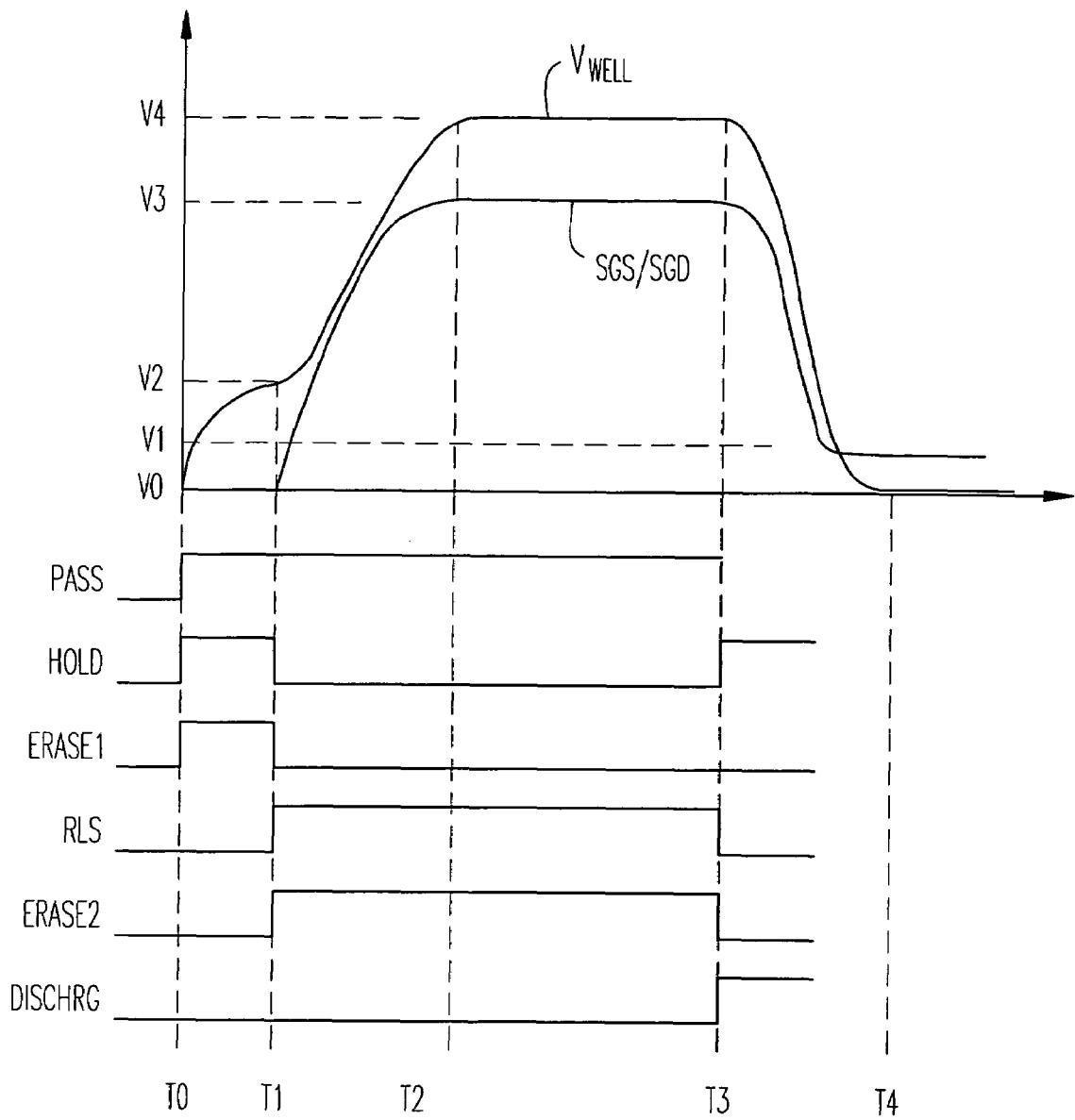
FIG. 7 is an example timing diagram of various signals of FIG. 6 during an erase operation.

FIG. 7 is an example timing diagram for various signals of FIG. 6 during an erase operation. The following description refers to both FIG. 6 and FIG. 7.

At time T0 enable unit 632 may activate the PASS signal to turn on transistors 634 to couple SGS and SGD to nodes 636. Enable unit 632 may also activate the HOLD signal to turn on transistors 633 to couple node 636 to node 637. In some embodiments, node 637 may be coupled to a voltage V0. Thus, at time T0, SGS and SGD may be coupled to V0 and may be held at V0 as long as transistors 633 remain turned on by the activation of the HOLD signal.

Also at time T0, monitor 643 may activate the ERASE1 signal to turn on transistor 644 to couple well 607 to $V_{ERASE1}$. Well 607 may be charged by $V_{ERASE1}$ between time T0 and time T1 such that $V_{WELL}$ may rise from V0 to V2 at time T1. In some embodiments, monitor 643 may include a timer in which the timer may measure the time interval between T0 and T2 to provide an indication when $V_{WELL}$ reaches V2. In some embodiments, monitor 643 may include a comparator to compare $V_{WELL}$ with a known voltage (e.g., voltage equal to V2) to provide a comparison result indicating when $V_{WELL}$ reaches V2.

At time T1 in FIG. 7, when $V_{WELL}$ reaches V2, monitor 643 (FIG. 6) may activate the EN-RLS signal. In response to the EN-RLS signal, enable unit 632 may deactivate the HOLD signal to turn off transistors 633 and activate the RLS signal to turn on transistors 635. SGS and SGD may be released from node 637 (or release from V0) when transistors 633 are turned off. Because transistors 633 may be turned off and transistors 635 may be turned on at time T1, nodes 636 may be coupled to $V_F$ at time T1. $V_F$ may be lower than V2 or equal to V2. In some embodiments, $V_F$ may be about three volts. In other embodiments, $V_F$ may be equal to the supply voltage (e.g., Vcc of FIG. 1) of memory device 600. Transistors 634 may be turned off when nodes 636 are coupled to $V_F$. When transistors 634 are turned off and nodes 636 have a voltage $V_F$ at time T1, SGS and SGD may float.

At time T1, when $V_{WELL}$ reaches V2, monitor 643 may deactivate the ERASE1 signal to turn off transistor 644 and decouple well 607 from $V_{ERASE1}$, and activate the ERASE2 signal to turn on transistor 645 to couple well 607 to $V_{ERASE2}$. $V_{WELL}$ may continue to rise from V2 to V4 when $V_{ERASE2}$ may be coupled to well 607. Since SGS and SGD may be released from node 637 and float, SGS and SGD may also rise from V0 to V3 as $V_{WELL}$ may rise from V2 to V4.

At time T2, $V_{WELL}$ may reach V4 and SGS and SGD may reach V3.

Between times T2 and time T3, monitor 643 may keep the ERASE2 signal activated such that $V_{WELL}$ may remain at V4. Enable unit 632 may keep the RLS signal activated such that SGS and SGD may remain at V3. In some embodiments, the time interval between T2 and T3 may be from about 200 μs to about 1000 μs. In some embodiments, the time interval between T2 and T3 may have other values.

From time T3 to time T4, monitor 643 may deactivate the ERASE2 signal (e.g., at time T3) to turn off transistor 645 to decouple well 607 from $V_{ERASE2}$. Monitor 643 may also activate the DISCHRG signal to turn on transistor 646. Well 607 may begin to discharge to node 647 through transistor 646. As shown in FIG. 7, between times T3 and T4, as well 607 discharges, $V_{WELL}$ may drop from V4 to V0. Also from time T3 to time T4, enable unit 632 may deactivate the RLS signal to turn off transistors 635 and activate the HOLD signal to turn on transistors 633. SGS and SGD may also discharge to node 637 through transistors 633. As shown in FIG. 7, SGS and SGD drop from V3. At a time after time T3, SGS and SGD may be held at V1 to discharge bit line 641.

Thus, as described above with reference to FIG. 6 and FIG. 7, during an erase operation, well 607 of memory device 600 may have two $V_{WELL}$ voltage profiles (V0 to V2 and V2 to V4) in which the voltage levels of SGS and SGD may be held at a first gate voltage level (e.g., V0) then released from first gate voltage level when $V_{WELL}$ is at least equal to an intermediate well voltage level (e.g., V2). After SGS and SGD are released from the first gate voltage level, SGS and SGD may float and rise to V3 as $V_{WELL}$ rises to V4 in which V3 may be lower than V4.

Figure 8:
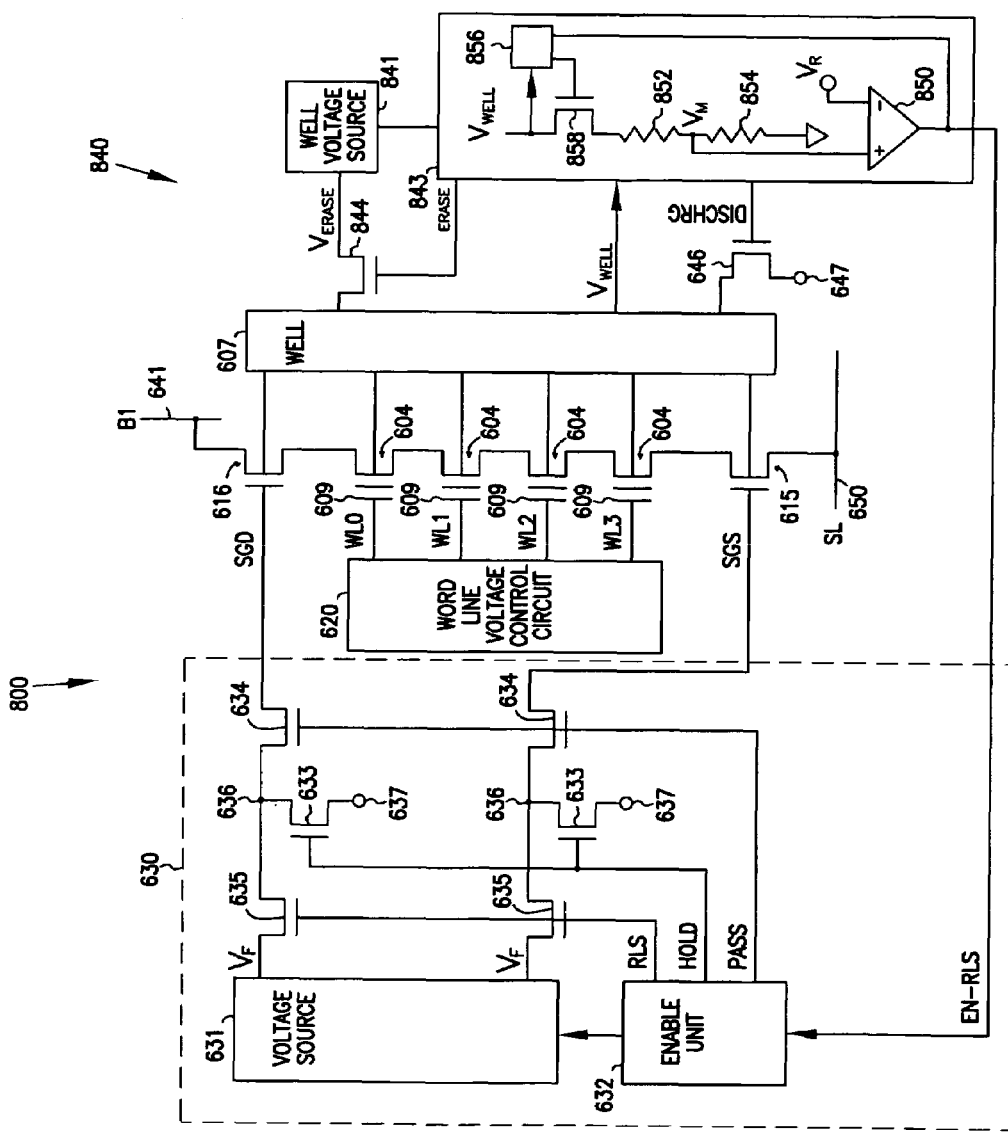
FIG. 8 shows a partial schematic diagram of a flash memory device with an erase voltage source and a comparator according an embodiment of the invention.

FIG. 8 shows a partial schematic diagram of a flash memory device 800 with an erase voltage source and a comparator according an embodiment of the invention. Memory device 800 of FIG. 8 may be similar to memory device 600 of FIG. 6 except for a well voltage control circuit 840 in FIG. 8. For simplicity, similar circuit elements in FIG. 6 and FIG. 8 are labeled with similar reference numbers.

In FIG. 8, well voltage control circuit 840 may include well voltage source 841 to provide an erase voltage $V_{ERASE}$, and a monitor 843 to monitor $V_{WELL}$. Monitor 843 may include a comparator 850 to compare a measuring voltage $V_M$ with a known voltage $V_R$. $V_M$ may be a function of $V_{WELL}$ and a voltage divider formed by resistors 852 and 854. In some embodiments, the value of resistors 852 and 854 may be chosen such that $V_M$ may correspond to an intermediate well voltage level (e.g., V2 in FIG. 5 and FIG. 7 above or FIG. 9 below). Comparator 850 may activate the EN-RLS signal when $V_M$ is greater than $V_R$. A control unit 856 may turn on transistor 858 during a measurement of $V_M$ and turn off transistor 858 when a measurement result is obtained. For example, control unit 856 may turn on transistor 858 when $V_M$ is lower than $V_R$ and turn off transistor 858 when the EN-RLS signal is activated, indicating that the measurement result is obtained. Control unit 856 may also allow monitor 843 to control the activation of the signals ERASE and DISCHRG. In some embodiments, $V_{WELL}$ and SGS and SGD of memory device 800 may have a voltage profiles similar to FIG. 5.

Figure 9:
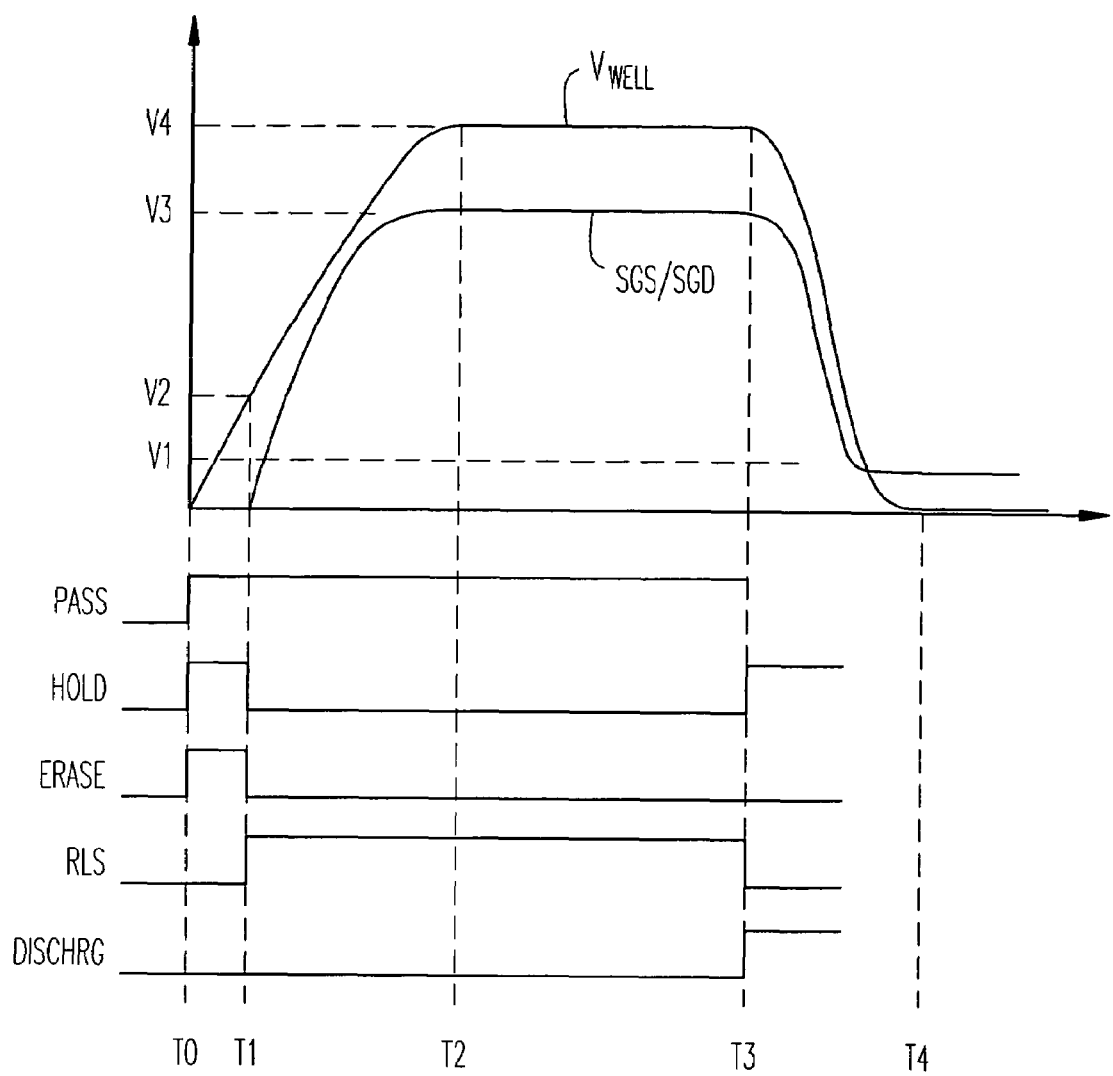
FIG. 9 is an example timing diagram of various signals of FIG. 8 during an erase operation.

FIG. 9 is an example timing diagram for various signals of FIG. 8 during an erase operation. At time T0, enable unit 632 of FIG. 8 may activate the PASS and HOLD signals to turn on transistors 634 and 633, thereby holding SGS and SGD at V0 in which V0 may be the voltage at node 637. Monitor 843 may activate the ERASE signal at time T0 to signal to turn on transistor 844 to couple well 607 to $V_{ERASE}$. Monitor 843 may monitor $V_{WELL}$ by measuring $V_M$ to determine when $V_{WELL}$ reaches the intermediate well voltage level.

At time T1, $V_M$ may be greater than $V_R$, causing comparator 850 to activate the EN-RLS signal. In response to the EN-RLS signal, enable unit 632 may deactivate the HOLD to signal to turn off transistors 633 to release SGS and SGD from node 637 (e.g., V0). Enable unit 632 may activate the RLS signal to turn on transistors 635 to couple node 636 to $V_F$. SGS and SGD may float when node 636 is coupled to $V_F$.

Between time T1 to time T2, SGS and SGD may rise from V0 to V3 as $V_{WELL}$ may continue to rise from V2 to V4. At time T2, $V_{WELL}$ may reach V4 and SGS and SGD may reach V3.

Between times T2 and time T3, $V_{WELL}$ may remain at V4 and SSG and SGD may remain at V3.

From time T3 to time T4, monitor 843 may deactivate the ERASE signal (e.g., at time T3) to decouple well 607 from $V_{ERASE}$, and activate the DISCHRG signal to discharge well 607 via transistor 646.

Also from time T3 to time T4, enable unit 632 may deactivate the RLS and activate the HOLD signal to discharge SGS and SGD through transistors 633.

At a time after time T3, SGS and SGD may be held at V1 to discharge bit line 641.

Figure 10:
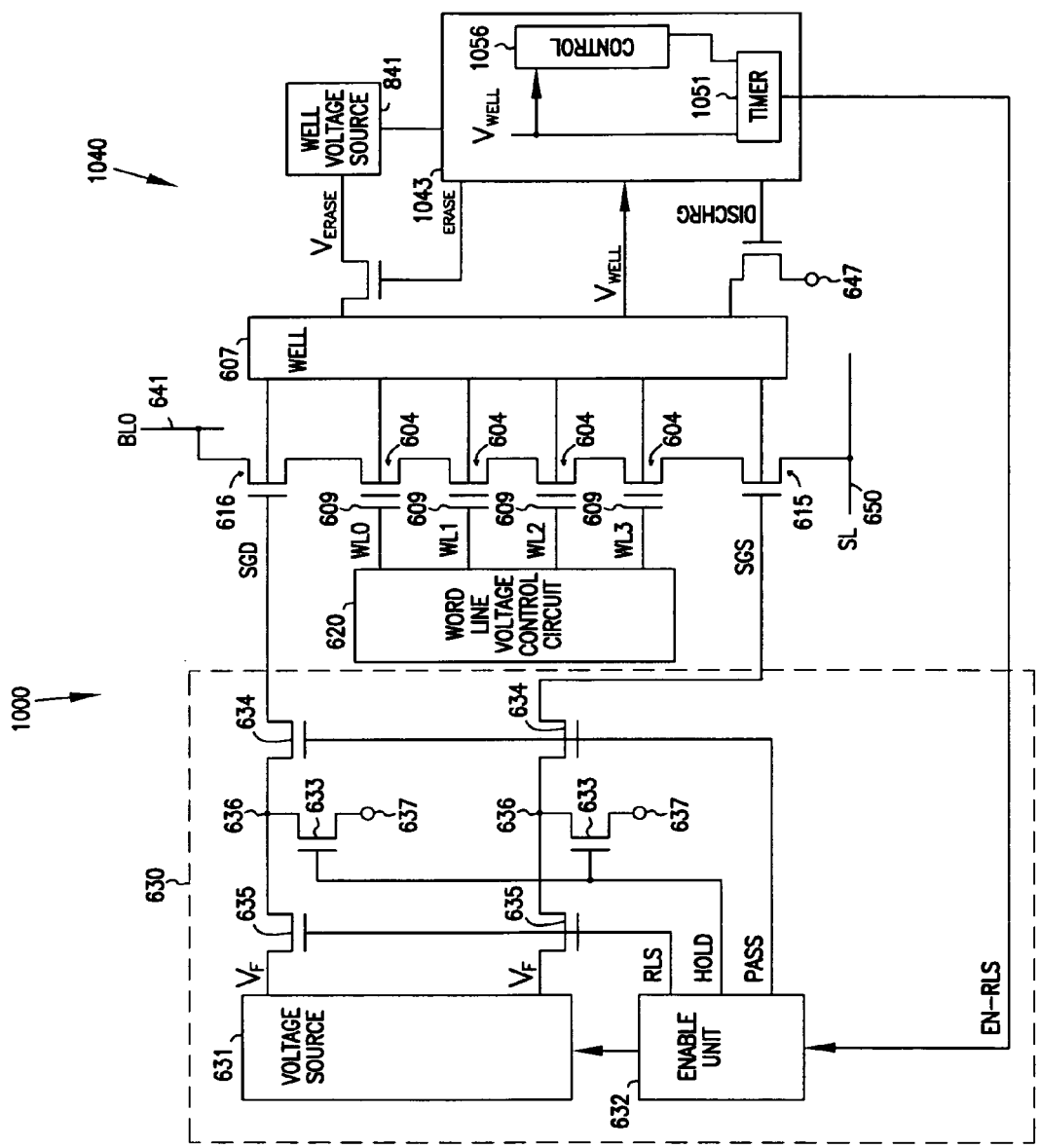
FIG. 10 shows a partial schematic diagram of a memory device with an erase voltage source and a timer according an embodiment of the invention.

FIG. 10 shows a partial schematic diagram of a flash memory device 1000 with an erase voltage source and a timer according an embodiment of the invention. Memory device 1000 of FIG. 10 may be similar to memory device 800 of FIG. 8 except for a well voltage control circuit 1040 in FIG. 10. For simplicity, similar circuit elements in FIG. 8 and FIG. 10 are labeled with similar reference numbers.

In FIG. 10, well voltage control circuit 1040 may include well voltage source 841 to provide an erase voltage $V_{ERASE}$, and a monitor 1043 to monitor $V_{WELL}$. Monitor 1043 may include a timer 1051 to provide information corresponding to $V_{WELL}$ to indicate when $V_{WELL}$ reaches an intermediate well voltage level (e.g., V2 in FIG. 5, FIG. 7, and FIG. 9 above). In some embodiments, timer 1051 may include RC circuitry to provide information such as an output signal based on $V_{WELL}$ in which the signal level of the output signal may indicate when $V_{WELL}$ reaches the intermediate well voltage level. In FIG. 10, a control unit 1056 may interact with timer 1051 to control the activation of the signals ERASE, DISCHRG, and EN-RLS. For example, when $V_{WELL}$ reaches the intermediate well voltage level, the EN-RLS signal may be activated. Enable unit 632 of FIG. 10 may respond to the EN-RLS in a fashion similar to that of enable unit 632 of memory device 800 of FIG. 8. In FIG. 10, $V_{WELL}$ and SGS and SGD of memory device 1000 may have similar or identical voltage profiles to those of memory devices 400, 600, and 800 of FIG. 4, FIG. 6, and FIG. 8. For example, a timing diagram for various signals of memory device 1000 of FIG. 10 may be similar to that of FIG. 9.

Figure 11:
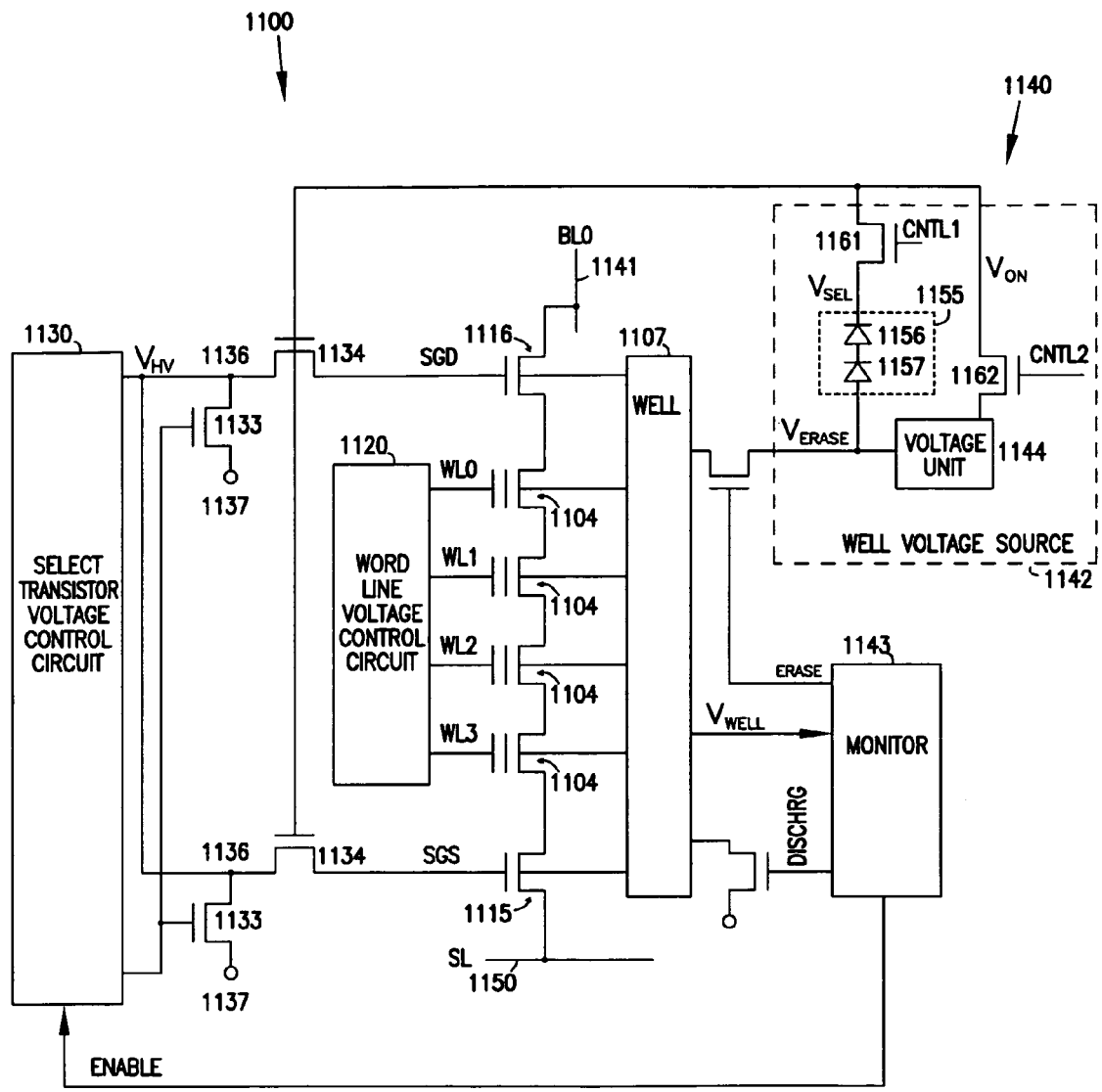
FIG. 11 shows a partial schematic diagram of a memory device with a first select transistor control circuitry according an embodiment of the invention.

FIG. 11 shows a partial schematic diagram of a flash memory device 1100 with a first select transistor control circuitry according an embodiment of the invention. Memory device 1100 may include a string of memory cells 1104 with corresponding word lines signals WL0, WL1, WL2, and WL3 from a word line voltage control circuit 1120, select transistors 1115 and 1116 with corresponding signals SGS and SGD, a source line 1150 with source line signal SL, a bit line 1141 with bit line signal BL. Memory cells 1104 and select transistors 1115 and 1116 may be coupled to a well, which is schematically shown as well 1107. Memory device 1100 may include a well voltage control circuit 1140 having a well voltage source 1142, and a monitor 1143 to monitor $V_{WELL}$ and control the activation of signals ERASE, DISCHRG, and ENABLE. The functions of the ERASE and DISCHARGE may be similar or identical to those of memory devices 400, 600, 800, and 1000 of described above with reference to FIG. 4 through FIG. 10. In FIG. 11, a select transistor voltage control circuit 1130 may respond to the ENABLE signal to active transistors 1133 to discharge bit line 1141 in an erase operation. During an erase operation, circuit 1130 may also provide a voltage $V_{HV}$ at node 1136. In some embodiments, $V_{HV}$ maybe equal to $V_{ERASE}$.

Well voltage source 1142 may include a voltage unit 1144 to provide an erase voltage $V_{ERASE}$, a select voltage $V_{SEL}$, and a voltage $V_{ON}$. In some embodiments, $V_{HV}$ may be provided by voltage unit 1144. $V_{ERASE}$, $V_{SEL}$, and $V_{ON}$ may have different voltage values. For example, $V_{ERASE}$ may be about 16 volts to about 22 volts, $V_{SEL}$ may be about 10 percent to about 50 percent lower than $V_{ERASE}$, and $V_{ON}$ may be about three volts to about six volts. $V_{WELL}$ may be related to $V_{ERASE}$ such that during an erase operation, the voltage level of $V_{WELL}$ may be equal to the voltage level of $V_{ERASE}$.

As shown in FIG. 11, well voltage source 1142 may include a unit 1155 to reduce $V_{ERASE}$ to obtain $V_{SEL}$. In some embodiments, $V_{SEL}$ may be obtained directly from voltage unit 1144.

$V_{SEL}$ and $V_{ON}$ may be applied to the gate of transistors 1134 at different times. For example, during an erase operation when $V_{HV}$ is provided to node 1136, well voltage source 1142 may deactivate a signal CTL2 to turn off a transistor 1162 and activate a signal CTL1 to turn on a transistor 1161 to apply $V_{SEL}$ to the gates of transistors 1134 such that SGS and SGD may have a voltage of about $V_{SEL}$ (e.g., $V_{SEL}$ minus the threshold voltage of transistors 1134) during the erase operation. During an erase operation, since $V_{WELL}$ may be equal to $V_{ERASE}$ and $V_{SEL}$ may be lower than $V_{ERASE}$, $V_{SEL}$ may also be lower than $V_{WELL}$. In another example, at near the end of an erase operation (e.g., between times T3 and T4 in FIG. 5), $V_{HV}$ may be decoupled from node 1136 and well voltage source 1142 may deactivate the CTL1 signal and activate the CTL2 signal to turn on a transistor 1162 to apply $V_{ON}$ to transistors 1134 to allow SGS and SGD to discharge to node 1137 while transistors 1133 are turned on.

FIG. 11 shows an example where unit 1155 has multiple series connected diodes 1156 and 1157 to cause $V_{SEL}$ to be lower than $V_{ERASE}$ by a voltage difference that is equivalent to the voltage drop among diodes 1156 and 1157. In some embodiments, unit 1155 may include a different number of diodes or other circuit elements to reduce $V_{ERASE}$ to obtain $V_{SEL}$ such that $V_{SEL}$ has a lower voltage value than $V_{ERASE}$.

Figure 12:
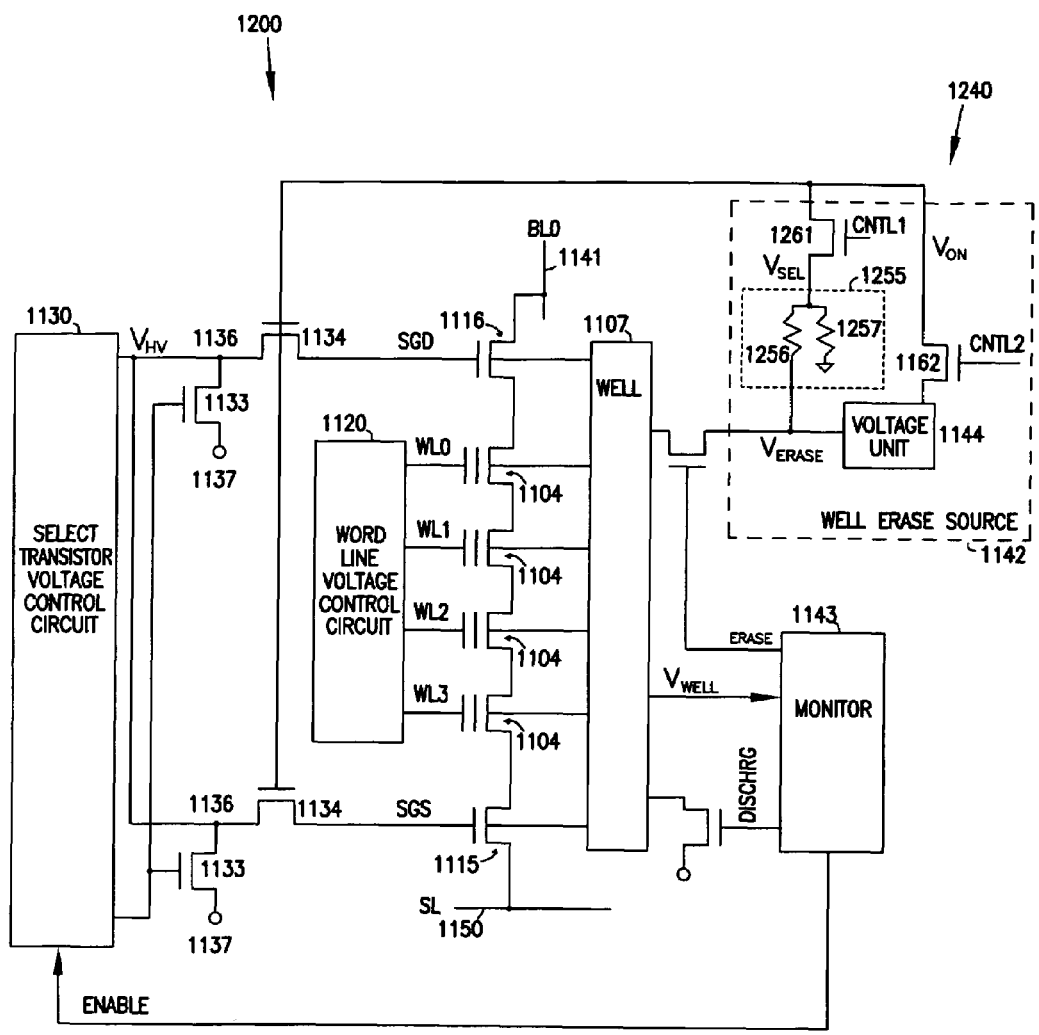
FIG. 12 shows a partial schematic diagram of a memory device with a second select transistor control circuitry according an embodiment of the invention.

FIG. 12 shows a partial schematic diagram of a memory device with a second select transistor control circuitry according an embodiment of the invention. Memory device 1200 of FIG. 12 may be similar to memory device 1100 of FIG. 11 except for a well voltage control circuit 1240 in FIG. 12. For simplicity, similar circuit elements in FIG. 11 and FIG. 12 are labeled with similar reference numbers. In FIG. 12, well voltage control circuit 1240 may include a unit 1255 having resistors 1256 and 1257 arranged in a voltage divider arrangement. The voltage value of $V_{SEL}$ may be chosen to be lower than that of $V_{ERASE}$ by appropriately setting resistance values for resistors 1256 and 1257. By activating CTL1 and CTL2 at different times, $V_{SEL}$ and $V_{ON}$ may be applied to the gates of transistors 1134 at different times in a fashion similar or identical to those of the application of $V_{SEL}$ and $V_{ON}$ in FIG. 11. For example, $V_{SEL}$ may be applied to the gates of transistors 1134 during an erase operation such that SGS and SGD may have a voltage lower than $V_{HV}$ or $V_{WELL}$.

Figure 13:
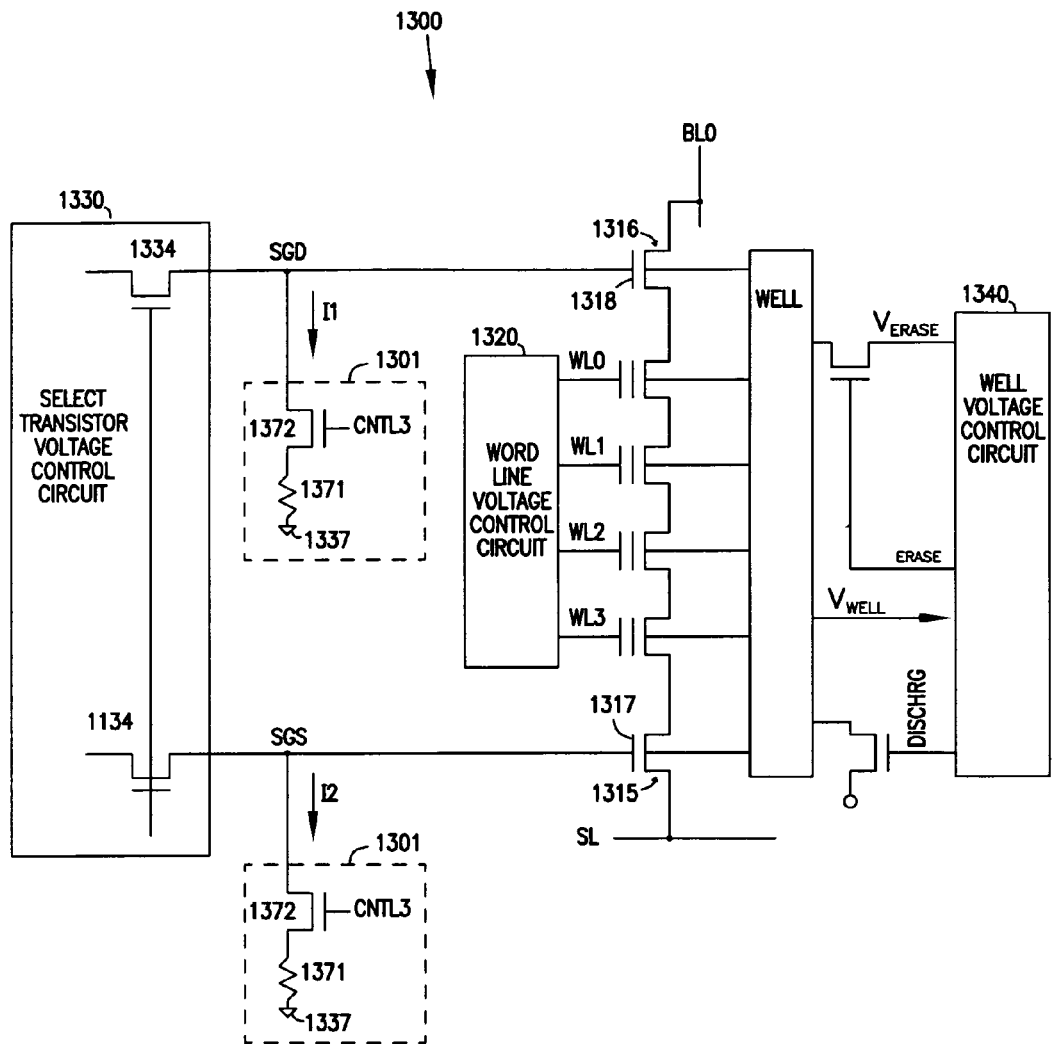
FIG. 13 shows a partial schematic diagram of a memory device with a third select transistor control circuitry according an embodiment of the invention.

FIG. 13 shows a partial schematic diagram of a memory device with a third select transistor control circuitry according an embodiment of the invention. Memory device 1300 of FIG. 13 may be similar to memory devices 400, 600, 800, 1000, 1100, 1200 described above with reference to FIG. 4 through FIG. 12. For example, memory device 1300 may include a word line voltage control circuit 1320, a select transistor voltage control circuit 1330, and a well voltage control circuit 1340.

In FIG. 13, memory device 1300 may include units 1301 to create a current I1 between a gate 1317 of a select transistor 1315 and node 1337 and a current I2 between a gate 1318 of a select transistor 1316 and node 1337 when the well voltage $V_{WELL}$ is raised from a first well voltage level to a second well voltage level during an erase operation. I1 may be equal to I2. Each unit 1301 may include a resistor 1371 and a transistor 1372 coupled in series between gate 1317 and node 1337 or between gate 1318 and node 1337. During an erase operation, a control signal CTL3 may be selectively activated to turn on transistor 1372 and create circuit path between gate 1317 and node 1337 and between gate 1318 and node 1337. A voltage drop may occur across resistor 1371 and a transistor 1372 such that when $V_{WELL}$ rises, SGS and SGD may also rise but a second voltage value of SGS and SGD (e.g., V3 in FIG. 5) may be lower than a second voltage value (e.g., V4) of $V_{WELL}$.

In FIG. 13, resistor 1371 and a transistor 1372 may be constructed such that SGS and SGD may not be reduced to the voltage at node 1337 during an erase operation. For example, during an erase operation, when $V_{WELL}$ is at the second well voltage level (e.g., V4 between times T2 and T3 in FIG. 5) SGS and SGD may be lower than $V_{WELL}$ (e.g., V3 between times T2 and T3 in FIG. 5) but may not be reduced to a voltage that is substantially lower than $V_{WELL}$ (e.g., V0 of FIG. 5). In FIG. 13, during an erase operation, transistor 1134 may be turned off when transistor 1372 is turned on.

Figure 14:
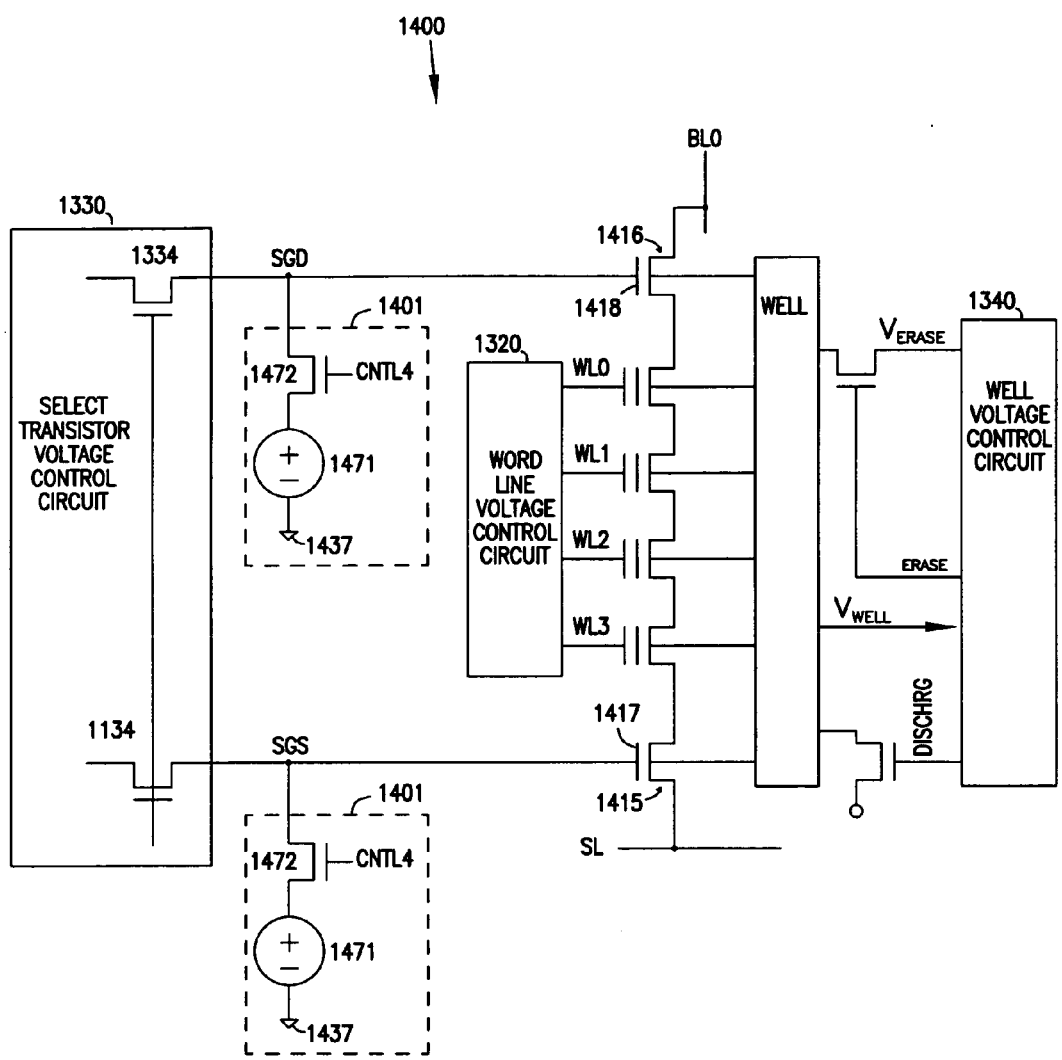
FIG. 14 shows a partial schematic diagram of a memory device with a fourth select transistor control circuitry according to an embodiment of the invention.

FIG. 14 shows a partial schematic diagram of a memory device with a fourth select transistor control circuitry according an embodiment of the invention. Memory device 1400 of FIG. 14 may be similar to memory devices 400, 600, 800, 1000, 1100, 1200, and 1300 of described above with reference to FIG. 4 through FIG. 13. In FIG. 14, memory device 1400 may include units 1401 to provide a voltage represented by SGS at a gate 1417 of a select transistor 1415 and a voltage represented by SGD at a gate 1418 of a select transistor 1416 during an erase operation. Each unit 1401 may include a voltage source 1471 and a transistor 1472 coupled in series between gate 1417 and node 1437 or between gate 1418 and node 1437. During an erase operation, a control signal CTL4 may be selectively activated to turn on transistor 1472 to couple voltage source 1471 directly to gate 1417 and 1418 when the $V_{WELL}$ is raised from the first well voltage level to the second well voltage level. For example, during an erase operation, when $V_{WELL}$ is at the second well voltage level (e.g., V4 between times T2 and T3 in FIG. 5) voltage source 1471 may provide a voltage to gate 1471 and gate 1418 such that SGS and SGD may be lower than $V_{WELL}$ (e.g., V3 between times T2 and T3 in FIG. 5). In FIG. 14, during an erase operation, transistor 1134 may be turned off when transistor 1472 is turned on.

Figure 15:
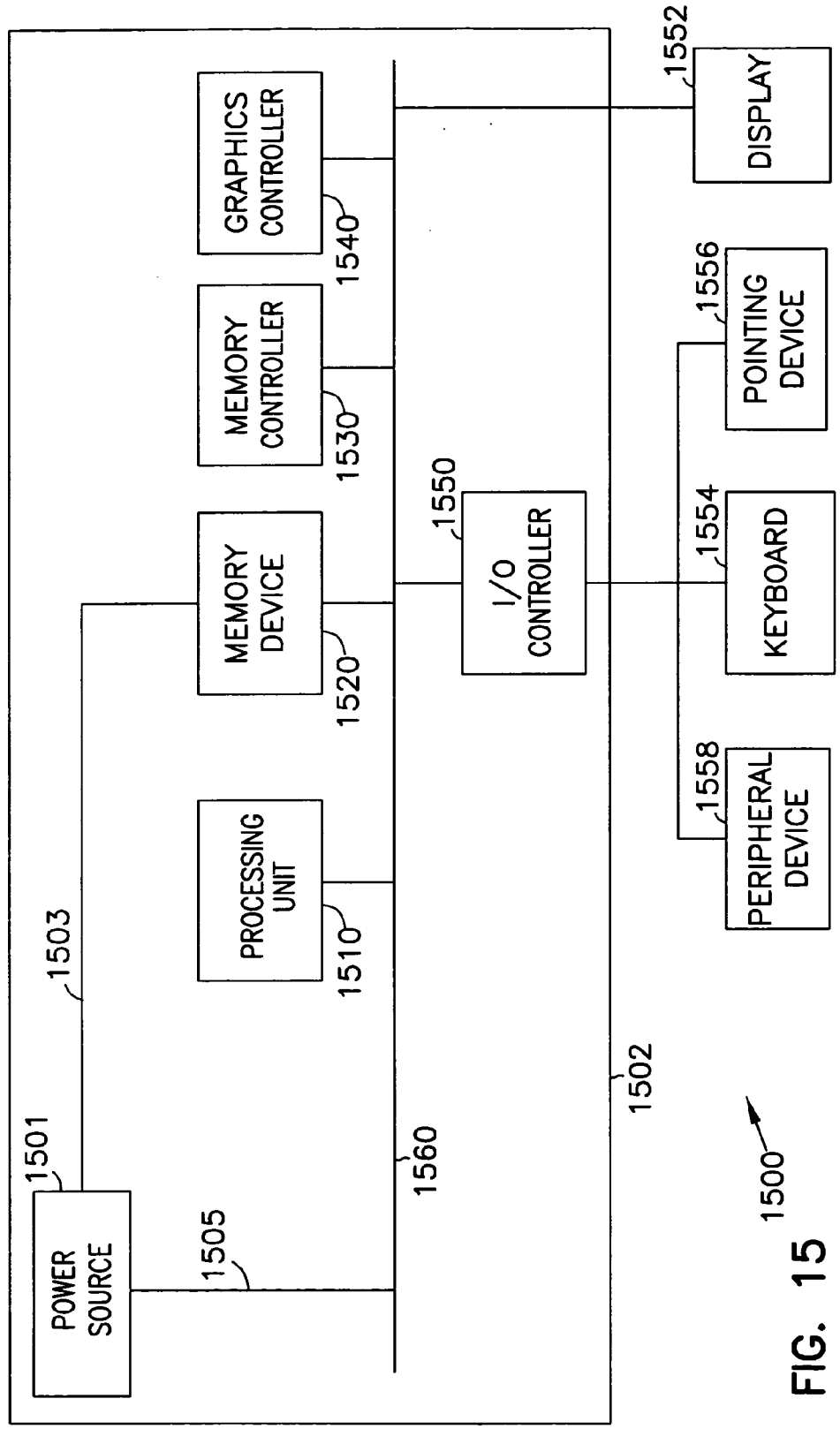
FIG. 15 shows a block diagram of a system according an embodiment of the invention.

FIG. 15 shows a block diagram of a system 1500 according to an embodiment of the invention. System 1500 may include a processing unit 1510, a memory device 1520, a memory controller 1530, a graphics controller 1540, an input and output (I/O) controller 1550, a display 1552, a keyboard 1554, a pointing device 1556, a peripheral device 1558, and a bus 1560. System 1500 may also include a circuit board 1502 on which some components of system 1500 may be located, as shown in FIG. 15. Circuit board 1502 may include terminals 1503 and 1505 coupled to a power source 701 to provide power or voltage to the components of system 1500 including memory device 1520. Power source 1501 may be provided by an alternating current to direct current (AC to DC) converting circuitry, a battery, or others. Memory device 1520 may be a volatile memory device, a non-volatile memory device, or a combination of both. For example, memory device 1520 may be a dynamic random access memory (DRAM) device, a static random access memory (SRAM) device, a flash memory device, or a combination of these memory devices. I/O controller 1550 may include a communication module for wired or wireless communication. In some embodiments, the number of components of system 1500 may vary.

Processing unit 1510 may process data transferred to and from other components via bus 1560. Processing unit 1510 may include a general-purpose processor or an application specific integrated circuit (ASIC). Processing unit 1510 may be a single core processing unit or a multiple-core processing unit.

In some embodiments, memory device 1520 may include an embodiment of memory devices 100, 400, 600, 800, 1000 described above with reference to FIG. 1 through FIG. 15.

System 1500 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape players, compact disc players, video cassette recorders, camcorders, digital cameras, MP3 (Motion Picture Experts Group, Audio Layer 3) players, video games, watches, etc.), and the like.

Figure 16:
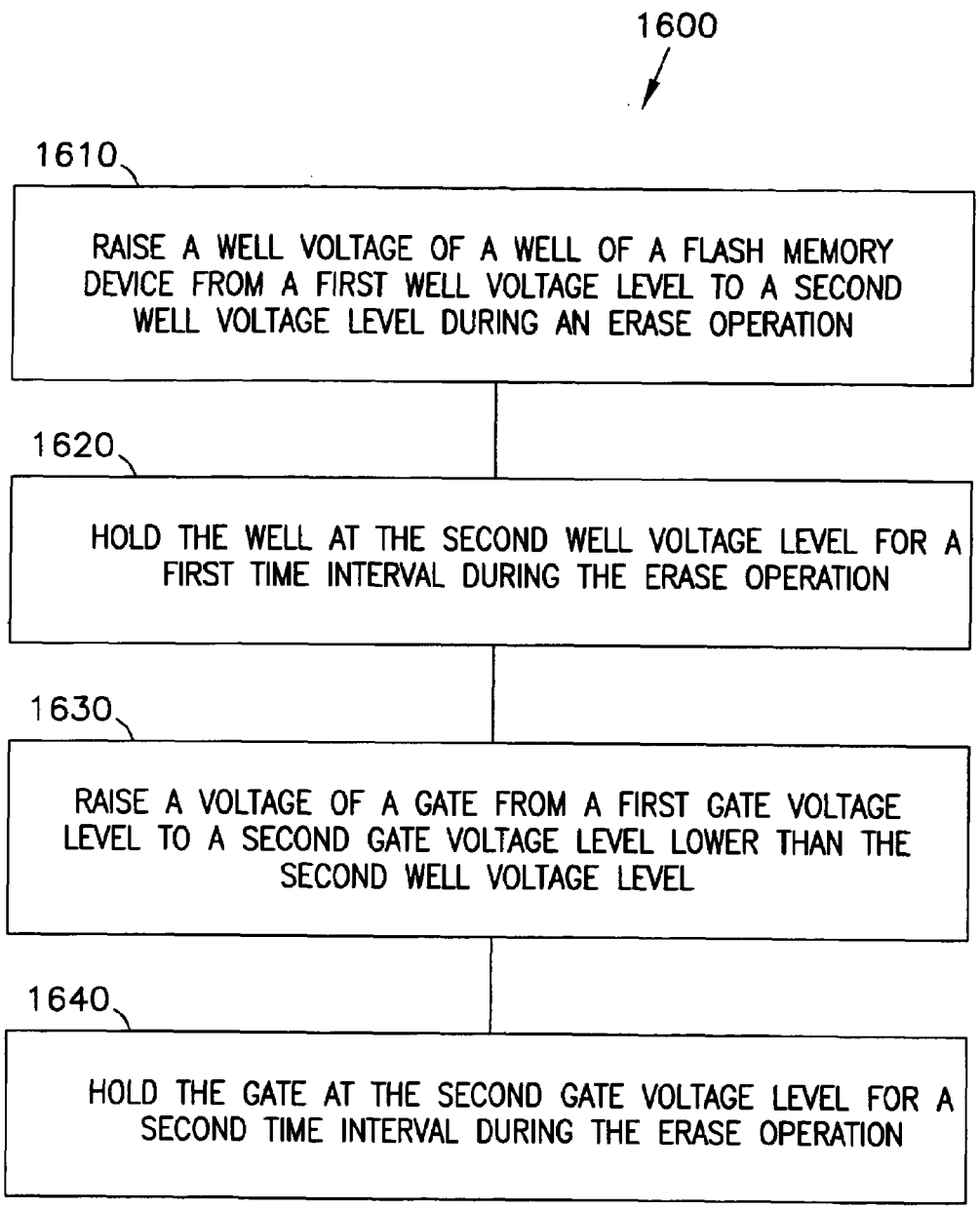
FIG. 16 is a flowchart of a method according to an embodiment of the invention.

FIG. 16 is a flowchart of a method 1600 according to an embodiment of the invention. Method 1600 may be used in the embodiments described above with reference to FIG. 1 through FIG. 15. Thus, the circuit elements used in method 1600 may include the circuit elements of the embodiments described above with reference to FIG. 1 through FIG. 10.

In method 1600 of FIG. 16, activity 1610 may raise a well voltage of a well of a flash memory device from a first well voltage level to a second well voltage level during an erase operation. In some embodiments, the flash memory device may include a NAND flash memory device. In FIG. 16, activity 1620 may hold the well at the second well voltage level for a first time interval during the erase operation. Activity 1630 may raise a voltage of a gate of a select transistor from a first gate voltage level to a second gate voltage level lower than the second well voltage level. The select transistor may be coupled between a bit line of the flash memory device and a plurality of flash memory cells of the flash memory device. Activity 1640 may hold the gate at the second gate voltage level for a second time interval during the erase operation.

The individual activities of method 1600 may not have to be performed in the order shown or in any particular order. Some activities may be repeated, and others may occur only once. Various embodiments may have more or fewer activities than those shown in FIG. 16. For example, in some embodiments, method 1600 may include the activities or operations of memory devices 100, 400, 600, 800, 1000, 1100, 1200, 1300, and 1400 and system 1500, as described above with reference to FIG. 1 through FIG. 15.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. A flash memory device comprising:
   a well in a substrate;
   a plurality of memory cells coupled to the well;
   a select transistor coupled between the memory cells and a bit line, the select transistor including a gate;
   a first circuit to raise a well voltage of the well during an erase operation from a first well voltage level to a second well voltage level, and to hold the well at the second well voltage level for a first time interval during the erase operation; and
   a second circuit to raise a voltage at the gate during the erase operation from a first gate voltage level to a second gate voltage level lower than the second well voltage level, to hold the gate at the second gate voltage level for a second time interval during the erase operation, and to hold the gate at the first gate voltage level when the first circuit raises the well voltage from the first well voltage level to an intermediate well voltage level lower than the second well voltage level and higher than the first well voltage level.

2. The flash memory device of claim 1, wherein the first circuit is hold the well at the second well voltage level for the first time interval of at least 20 microseconds, wherein the second circuit is to hold the gate at the second gate voltage level for the second time interval at least 20 microseconds.

3. A flash memory device comprising:
   a well in a substrate;
   a plurality of memory cells coupled to the well;
   a select transistor coupled between the memory cells and a bit line, the select transistor including a gate;
   a first circuit to raise a well voltage of the well during an erase operation from a first well voltage level to a second well voltage level, and to hold the well at the second well voltage level for a first time interval during the erase operation; and
   a second circuit to raise a voltage at the gate during the erase operation from a first gate voltage level to a second gate voltage level lower than the second well voltage level, and to hold the gate at the second gate voltage level for a second time interval during the erase operation, wherein the first circuit is to raise the well voltage from the first well voltage level to an intermediate well voltage level lower than the second well voltage level during the erase operation, wherein the second circuit is to hold the gate at the first gate voltage level during the erase operation when the well voltage is lower than the intermediate well voltage level, the second circuit is to release the gate from the first gate voltage level to allow the gate to rise to the second voltage level when the well voltage is at least equal to the intermediate well voltage level.

4. The flash memory device of claim 3, wherein the first circuit includes:
   a first voltage source to apply a first erase voltage to the well during the erase operation to raise the well voltage from the first well voltage level to the intermediate well voltage level; and
   a second voltage source to apply a second erase voltage to the well during the erase operation to rise from the intermediate well voltage level to the second well voltage level.

5. The flash memory device of claim 3, wherein one of the first and second circuits includes a comparator to compare the well voltage with another voltage to provide a comparison result, and wherein the second circuit is responsive to the comparison result to release the gate from the first gate voltage level.

6. The flash memory device of claim 3, wherein one of the first and second circuits includes a timer to provide information corresponding to the well voltage, and wherein the second circuit is responsive to the timer to release the gate from the first gate voltage level.

7. The flash memory device of claim 3, wherein the first circuit is to discharge the well after the well voltage reaches the second well voltage level, and wherein the second circuit is to discharge the gate after the gate reaches the second gate voltage level, and wherein the second circuit is to apply to the gate a voltage having a voltage level greater than the first gate voltage level to discharge the bit line after the well is discharged.

8. The flash memory device of claim 3, wherein the intermediate well voltage level is greater than ground, and wherein the first gate voltage level includes ground.

9. The flash memory device of claim 3 further comprising a third circuit to hold a control gate of each of the memory cells at the first gate voltage level during the erase operation.

10. The flash memory device of claim 1, wherein the second circuit includes:
a first transistor to couple the gate to a first node;
a second transistor to couple the first node to a second node to hold the gate at the first gate voltage level at the second node when the well voltage is lower than the intermediate well voltage level, and to decouple the first node to from the second node when the well voltage is at least equal to the intermediate well voltage level; and
a third transistor to couple the first node to a voltage source to apply to the first node a voltage with a voltage level greater than the level first gate voltage level when the well voltage is at least equal to the intermediate well voltage level.

11. The flash memory device of claim 1, wherein the second circuit includes at least one transistor couple between the gate and a node to hold the gate at the first gate voltage level at the node when the well voltage is lower than the intermediate well voltage level, and to decouple gate from the node when the well voltage is at least equal to the intermediate well voltage level, wherein the node is coupled to ground.

12. The flash memory device of claim 1, wherein the second circuit is to couple the gate to a node via a transistor, wherein the node is to have a node voltage level greater than the second gate voltage level during the erase operation, and wherein the a gate of the transistor is to have a voltage lower than the node voltage during the erase operation.

13. The flash memory device of claim 1, wherein the second circuit includes a unit to create a current between the gate and ground when the well voltage is raised from the first well voltage level to the second well voltage level.

14. The flash memory device of claim 1, wherein the second circuit includes a voltage source with a voltage terminal coupled to the gate, wherein the voltage source is to apply to the gate a voltage having the second gate voltage level when the well voltage is raised from the first well voltage level to the second well voltage level.

15. A system comprising:
a flash memory device including:
a well in a substrate;
a plurality of memory cells coupled to the well;
a select transistor coupled between the memory cells and a bit line, the select transistor including a gate;
a first circuit to raise a well voltage of the well from a first well voltage level to a second well voltage level during the erase operation, wherein the first circuit is hold the well at the second well voltage level for a first time interval during the erase operation; and
a second circuit to raise a voltage of the gate from a first gate voltage level to a second gate voltage level lower than the second well voltage level, wherein the second circuit is to hold the gate at the second gate voltage level for a second time interval during the erase operation, wherein the second circuit is to couple the gate to a node via a transistor, wherein the node is to have a node voltage level greater than the second gate voltage level during the erase operation, and wherein the a gate of the transistor is to have a voltage lower than the node voltage during the erase operation; and
a circuit board coupled to the flash memory device, the circuit board including a terminal to couple to a battery to provide a voltage to the flash memory device.

16. The system of claim 15, wherein the first circuit is to raise the well voltage from the first well voltage level to an intermediate well voltage level lower than the second well voltage level during the erase operation, wherein the second circuit is to hold the gate at the first gate voltage level during the erase operation when the well voltage is lower than the intermediate well voltage level, the second circuit is to release the gate from the first gate voltage level to allow the gate to rise to the second voltage level when the well voltage is at least equal to the intermediate well voltage level.

17. A method comprising:
raising a well voltage of a well of a flash memory device from a first well voltage level to a second well voltage level during an erase operation;
holding the well at the second well voltage level for a first time interval during the erase operation;
raising a voltage of a gate of a select transistor from a first gate voltage level to a second gate voltage level lower than the second well voltage level, the select transistor being coupled between a bit line of the flash memory device and a plurality of flash memory cells of the flash memory device, wherein raising the gate voltage includes:
coupling the gate to a node via a transistor, wherein the node has a node voltage level greater than the second gate voltage level during the erase operation; and
applying to a gate of the transistor a voltage lower than the node voltage during the erase operation; and
holding the gate at the second gate voltage level for a second time interval during the erase operation.

18. The method of claim 17, wherein the second well voltage level is a highest voltage level of the well during the erase operation, and wherein the second gate voltage level is a highest voltage level of the gate well during the erase operation.

19. The method of claim 17, wherein raising the gate voltage includes sinking a current on a current path between the gate and ground when the well voltage is raised from the first well voltage level to the second well voltage level.

20. The method of claim 17, wherein raising the gate voltage includes applying to the gate a voltage having the second gate voltage level when the well voltage is raised from the first well voltage level to the second well voltage level.

21. The method of claim 17, wherein raising the well voltage includes raising the well voltage from the first well voltage level to an intermediate well voltage level lower than the second well voltage level during the erase operation, wherein raising the gate voltage includes holding the gate at the first gate voltage level during the erase operation when the well voltage is lower than the intermediate well voltage level, and releasing the gate from the first gate voltage level to allow the gate to rise to the second voltage level when the well voltage is at least equal to the intermediate well voltage level.

22. The method of claim 21, wherein holding the gate at the first gate voltage level includes coupling the gate of the select transistor to a first node, coupling the first node to a second node to hold the gate at the first gate voltage level at the second node, and wherein releasing the gate from the first gate voltage level includes decoupling the first node to from the second node, and applying a source voltage to the first node.

23. The method of claim 22, wherein the source voltage has a voltage level greater than the first gate voltage level.

24. The method of claim 22, wherein the first well voltage level includes ground, and wherein the intermediate well voltage level has a range of about one volt to about six volts.

25. The method of claim 22, wherein holding the gate at the first gate voltage level includes holding the gate at ground.

26. The method of claim 22, wherein the first gate voltage level is lower than the intermediate well voltage level.

27. The method of claim 22, wherein the second well voltage level is in a range of about 16 volts to about 22 volts.

28. The method of claim 27, wherein the second gate voltage level is about 10 percent to about 50 percent lower than the second well voltage level.

* * * * *

UNITED STATES PATENT AND TRADEMARK OFFICE
CERTIFICATE OF CORRECTION

PATENT NO.        : 7,499,325 B2
APPLICATION NO.   : 11/614820
DATED             : March 3, 2009
INVENTOR(S)       : Doyle et al.

Page 1 of 1

It is certified that error appears in the above-identified patent and that said Letters Patent is hereby corrected as shown below:

In column 14, line 21, in Claim 2, after "is" insert -- to --.

In column 15, line 45, in Claim 12, before "gate" delete "a".

In column 15, line 65, in Claim 15, after "is" insert -- to --.

In column 16, line 10, in Claim 15, before "gate" delete "a".

Signed and Sealed this

Twelfth Day of May, 2009

JOHN DOLL
*Acting Director of the United States Patent and Trademark Office*